US010910245B2

(12) United States Patent
Yamaguchi

(10) Patent No.: US 10,910,245 B2
(45) Date of Patent: Feb. 2, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventor: Takahiro Yamaguchi, Kyoto (JP)

(73) Assignee: SCREEN Holdings Co., Ltd.

( * ) Notice: Subject to any disclaimer, the term of this patent is extended or adjusted under 35 U.S.C. 154(b) by 166 days.

(21) Appl. No.: 16/172,911

(22) Filed: Oct. 29, 2018

(65) Prior Publication Data

US 2019/0148192 A1 May 16, 2019

(30) Foreign Application Priority Data

Nov. 15, 2017 (JP) ................. 2017-220076

(51) Int. Cl.
*H01L 21/67* (2006.01)
*H01L 21/66* (2006.01)

(52) U.S. Cl.
CPC .... *H01L 21/67253* (2013.01); *H01L 21/6708* (2013.01); *H01L 21/67023* (2013.01);
(Continued)

(58) Field of Classification Search
CPC ............... H01L 21/67; H01L 21/67017; H01L 21/67023; H01L 21/67028; H01L 21/6703; H01L 21/67063; H01L 21/67075; H01L 21/6708; H01L 21/302; H01L 21/306; H01L 21/30604; H01L 21/30608; H01L 21/30617; H01L 21/46; H01L 21/461; H01L 21/465; H01L 21/471; H01L 21/67242; H01L 21/67253; H01L 21/67288; H01L 22/00; H01L 22/10; H01L 22/12; H01L 22/20; H01L 22/22; H01L 22/24; H01L 22/26; H05K 3/00; H05K 3/02; H05K 3/06; H05K 13/08;
(Continued)

(56) References Cited

U.S. PATENT DOCUMENTS

2013/0034918 A1* 2/2013 Dusemund ........ H01L 21/67023
438/8
2015/0128995 A1 5/2015 Kaneko et al.
(Continued)

FOREIGN PATENT DOCUMENTS

JP 3741655 B 2/2006
JP 2007-095415 A 4/2007
(Continued)

*Primary Examiner* — John P. Dulka
(74) *Attorney, Agent, or Firm* — Ostrolenk Faber LLP

(57) ABSTRACT

A substrate processing method includes a substrate rotating step of rotating a substrate in a horizontal posture, a processing liquid supplying step of supplying a processing liquid to an upper surface of the substrate which is being rotated in the substrate rotating step, a liquid film state monitoring step of monitoring a state of a liquid film formed on the upper surface of the substrate by the processing liquid supplied to the upper surface of the substrate, and a substrate rotational speed changing step of changing rotational speed of the substrate in accordance with the state of the liquid film monitored in the liquid film state monitoring step during execution of the processing liquid supplying step.

20 Claims, 12 Drawing Sheets

(52) U.S. Cl.
CPC .. *H01L 21/67051* (2013.01); *H01L 21/67288* (2013.01); *H01L 22/20* (2013.01); *H01L 22/26* (2013.01)

(58) Field of Classification Search
CPC ...... H05K 13/081; G05B 19/43; G05B 19/44; G06T 7/00; G06T 7/0002; G06T 7/0004; G06T 7/0006; G06T 7/0008; G06T 7/60; G06T 7/62; G06T 7/64; G06T 7/11; G06T 7/12; G06T 7/13; G06T 7/136
See application file for complete search history.

(56) References Cited

U.S. PATENT DOCUMENTS

| | | |
|---|---|---|
| 2015/0303078 A1 | 10/2015 | Ishibashi |
| 2017/0167029 A1 | 6/2017 | Hoshino et al. |

FOREIGN PATENT DOCUMENTS

| | | |
|---|---|---|
| JP | 2010-010242 A | 1/2010 |
| JP | 2010-062259 A | 3/2010 |
| JP | 2011-146683 A | 7/2011 |
| JP | 2015-204427 A | 11/2015 |
| JP | 2016-040812 A | 3/2016 |
| TW | 201532690 A | 9/2015 |
| TW | 201736639 A | 10/2017 |

* cited by examiner

FIG. 4

| Step | Content | Guard position | Substrate rotational speed | Nozzle position | Fluid | Flow rate | Execution time |
|---|---|---|---|---|---|---|---|
| 1 | Guard raising | Processing position | 0rpm | Home position | - | 0L/min | ***sec |
| 2 | Substrate rotating | Processing position | 1000rpm | Home position | - | 0L/min | ***sec |
| 3 | Nozzle moving | Processing position | 1000rpm | Substrate center | - | 0L/min | ***sec |
| 4 | Chemical liquid processing | Processing position | 100-2000rpm | Substrate center | Chemical liquid | 0.5-2L/min | ***sec |
| 5 | Rinsing processing | Processing position | 100-2000rpm | Substrate center | Rinse liquid | 0.5-2L/min | ***sec |
| 6 | Nozzle moving | Processing position | 100-2000rpm | Substrate center | - | - | ***sec |
| 7 | Spin-drying | Processing position | 100-2000rpm | Substrate center | Solvent | 0.1-5L/min | ***sec |
|   |   |   |   |   | $N_2$ | 50-100L/min |   |
| 8 | Substrate rotation stopping | Processing position | 0rpm | Home position | - | - | ***sec |
| 9 | Guard lowering | Home position | 0rpm | Home position | - | - | ***sec |

← R

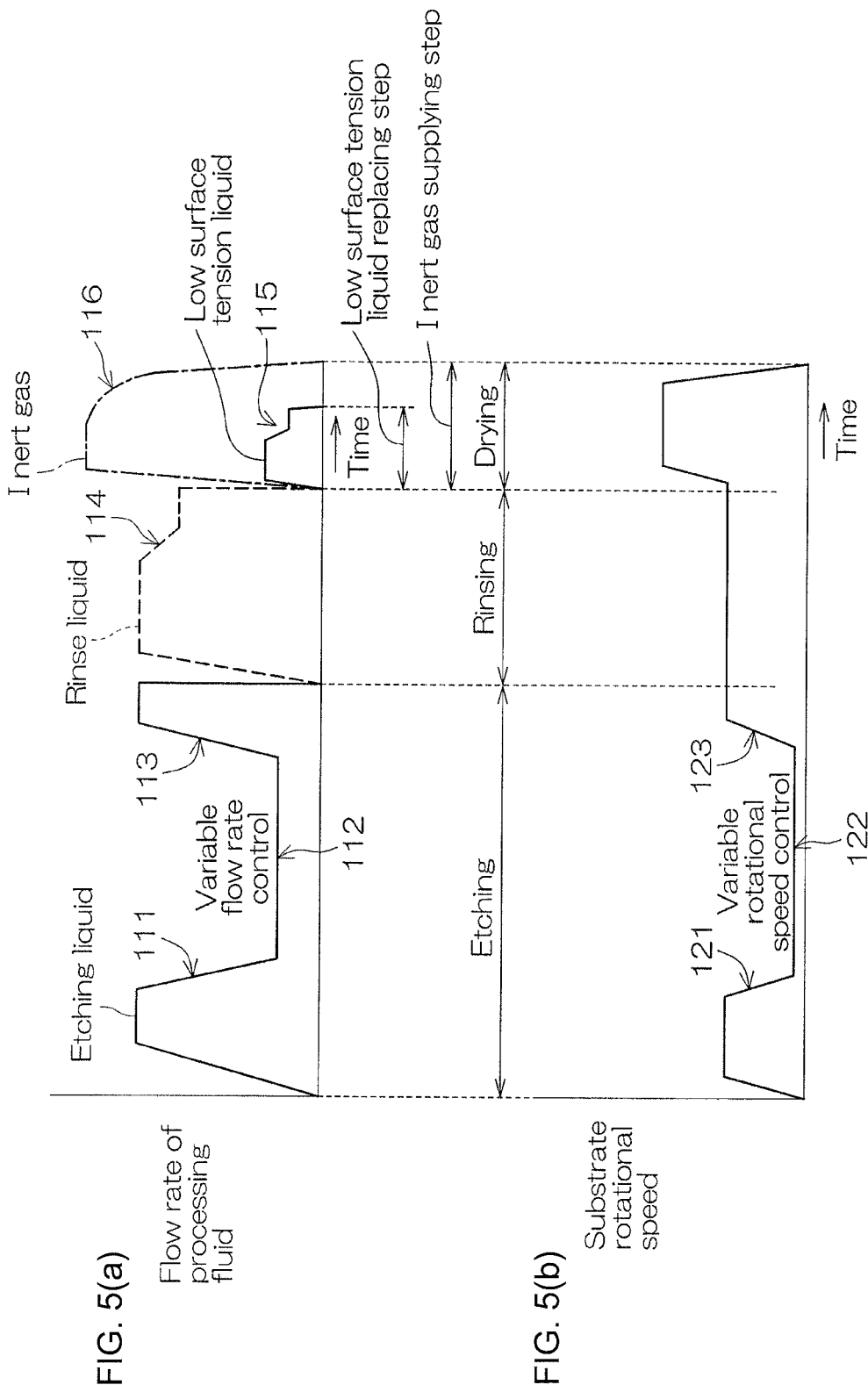

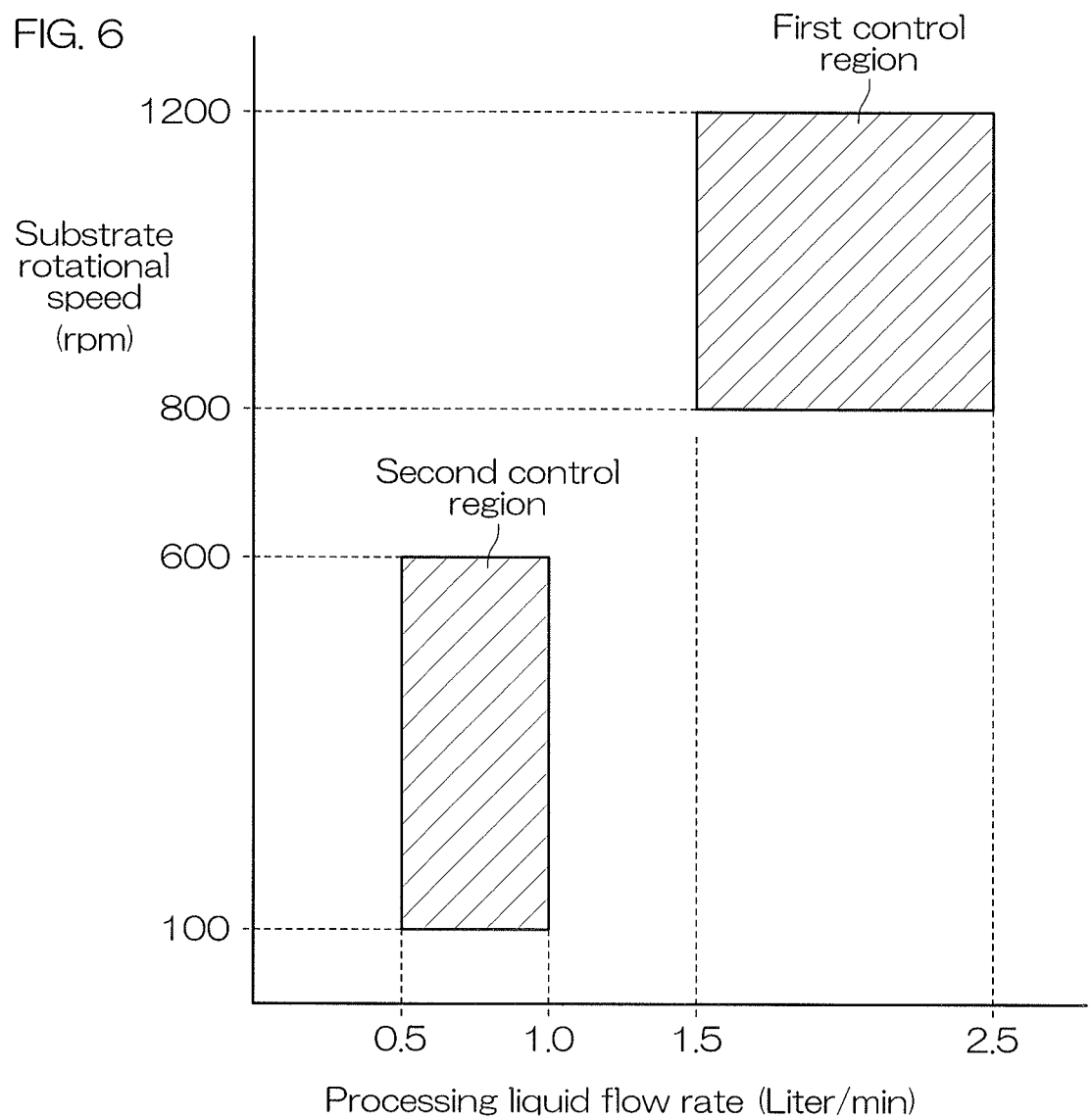

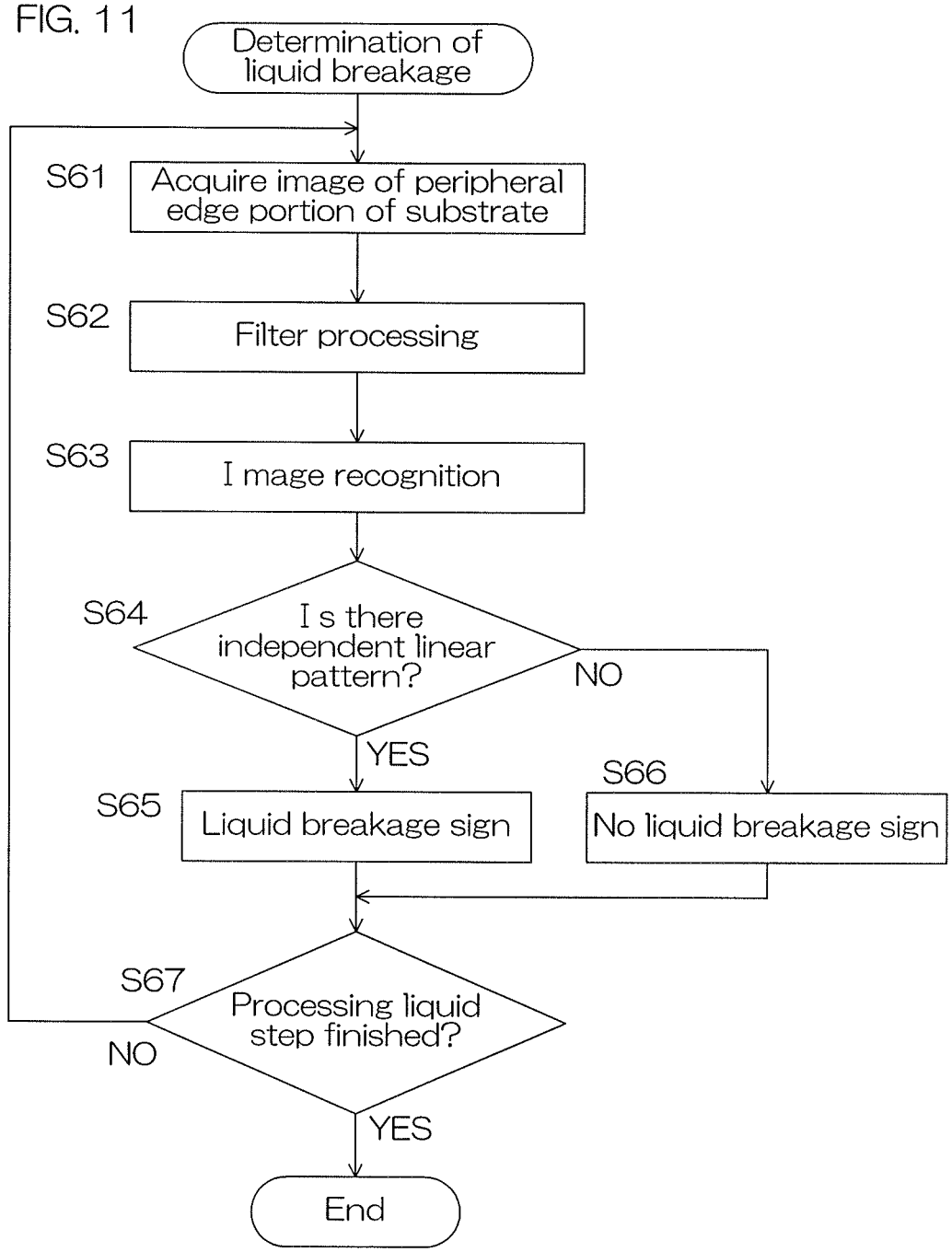

SUBSTRATE PROCESSING METHOD AND SUBSTRATE PROCESSING APPARATUS

CROSS REFERENCE TO RELATED APPLICATIONS

This application claims the benefit of priority to Japanese Patent Application No. 2017-220076 filed on Nov. 15, 2017. The entire contents of this application are hereby incorporated herein by reference.

BACKGROUND OF THE INVENTION

1. Field of the Invention

The present invention relates to a method and an apparatus for processing substrates with a processing liquid. The present invention also relates to a recording medium on which a computer program is recorded for executing the substrate processing method in the substrate processing apparatus. Examples of substrates to be processed include substrates such as semiconductor wafers, substrates for FPDs (flat panel displays) including liquid crystal display devices and organic EL (electroluminescence) display devices, substrates for optical disks, substrates for magnetic disks, substrates for magneto-optical disks, substrates for photomasks, ceramic substrates, substrates for solar cells, etc.

2. Description of the Related Art

In a manufacturing process of a semiconductor device, a liquid crystal display device, etc., processing such as film formation, etching, and cleaning is repeatedly executed. In order to execute precise substrate processing, there is sometimes a case where a single substrate processing type substrate processing apparatus that processes substrates one by one is used.

An example of such a single substrate processing type substrate processing apparatus is shown in Japanese Patent Application Publication No. 2010-10242. This substrate processing apparatus includes a spin chuck that horizontally holds and rotates a substrate, and a nozzle that discharges a processing liquid to a front surface of the substrate. Japanese Patent Application Publication No. 2010-10242 discloses chemical liquid processing in which a silicon oxide film on the front surface of the substrate is removed by etching. The silicon oxide film has a hydrophilic surface, whereas a silicon layer exposed by removing the silicon oxide film takes on a hydrophobic surface. Thus, at an initial stage of the chemical liquid processing, an etching liquid is discharged from the nozzle at a relatively low flow rate. When removal of the silicon oxide film progresses and the front surface of the substrate becomes a hydrophobic surface, the flow rate of the etching liquid is increased. Thereby, while changing the flow rate of the etching liquid in accordance with a change in the properties of the front surface of the substrate and secure coverage of the front surface of the substrate, a consumption amount of the etching liquid is suppressed.

SUMMARY OF THE INVENTION

In the prior art of Japanese Patent Application Publication No. 2010-10242, although a hydrophobic state of the front surface of the substrate is changed during the chemical liquid processing, the front surface of the substrate is always covered with the etching liquid. Thereby, although etching uniformity can be secured to some extent, in recent years, more precise uniformity is increasingly required.

For example, when the substrate is rotated, linear speed of portions of the substrate is zero at the rotation center, and is increased in proportion to a distance from the rotation center. Therefore, the linear speed differs greatly between the vicinity of the center and the vicinity of an outer periphery of the substrate. Consequently, the etching liquid is more easily evaporated in an outer peripheral portion of the substrate. Thus, especially when rotational speed of the substrate is high, there is a possibility that a temperature of the etching liquid is different between the center portion of the substrate and the outer peripheral portion of the substrate. Since an etching rate depends on the temperature of the etching liquid, there is a possibility that etching becomes non-uniform accordingly. Therefore, it is advantageous when, while holding a state where the entire front surface of the substrate is covered with the etching liquid, the rotational speed of the substrate is as low as possible. Such an issue is not discussed in Japanese Patent Application Publication No. 2010-10242.

Similar problems may occur not only in etching processing but also in a case where the front surface of the substrate is processed with a processing liquid.

Thus, one object of the present invention is to provide a substrate processing method and a substrate processing apparatus with which uniformity of processing can be improved and a consumption amount of a processing liquid can be suppressed.

Another object of the present invention is to provide a recording medium on which a computer program to execute a substrate processing method in a substrate processing apparatus is recorded, the substrate processing method with which uniformity of processing can be improved and a consumption amount of a processing liquid can be suppressed.

The present invention provides a substrate processing method including a substrate rotating step of rotating a substrate in a horizontal posture, a processing liquid supplying step of supplying a processing liquid to an upper surface of the substrate which is being rotated in the substrate rotating step, a liquid film state monitoring step of monitoring a state of a liquid film formed on the upper surface of the substrate by the processing liquid supplied to the upper surface of the substrate, and a substrate rotational speed changing step of changing rotational speed of the substrate in accordance with the state of the liquid film monitored in the liquid film state monitoring step during execution of the processing liquid supplying step.

With this method, the substrate is rotated in a horizontal posture, and the processing liquid is supplied to the upper surface of the substrate which is being rotated. The state of the liquid film of the processing liquid formed on the upper surface of the substrate is monitored, and the rotational speed of the substrate is changed in accordance with the state of the liquid film. Therefore, the rotational speed of the substrate can be optimized in accordance with the state of the liquid film. Thus, it is possible to improve uniformity of substrate processing.

In a preferred embodiment of the present invention, the substrate processing method further includes an entirely-covered state determining step of determining whether or not it is an entirely-covered state where the liquid film monitored in the liquid film state monitoring step covers the entire upper surface of the substrate after the processing liquid supplying step is started. The substrate rotational speed changing step includes a rotation decelerating step of reducing the rotational speed of the substrate when it is determined that it is the entirely-covered state in the entirely-covered state determining step.

A certain amount of time is required from landing of the processing liquid on the substrate to covering of the entire upper surface of the substrate. For example, the processing liquid is discharged toward the center of the substrate, and spreads to an outer peripheral edge of the substrate by a centrifugal force and covers the entire front surface of the substrate. In this case, a time difference occurs from when the processing liquid lands on the center of the substrate to when the processing liquid reaches the outer peripheral edge of the substrate. When the time difference is large, there is a possibility that the substrate processing becomes non-uniform.

Thus, when supply of the processing liquid is started, the rotational speed of the substrate is set to be relatively high, and when the entire upper surface of the substrate is covered with the liquid film of the processing liquid, the rotational speed of the substrate is reduced. Thereby, a time from when the supply of the processing liquid is started to when the liquid film covering the entire upper surface of the substrate is formed can be shortened. Thus, it is possible to uniformize the substrate processing. Moreover, when the entire upper surface of the substrate is covered, the rotational speed of the substrate is reduced. Thus, linear speed of an outer peripheral portion of the substrate is reduced, and evaporation of the processing liquid is suppressed. As a result, a temperature of the processing liquid forming the liquid film can be uniformized over the vicinity of the rotation center and a peripheral edge portion of the substrate. Thus, the substrate processing is further uniformized.

In a preferred embodiment of the present invention, the substrate processing method further includes a liquid breakage sign determining step of determining whether or not the liquid film monitored in the liquid film state monitoring step has a liquid breakage sign to break out from the entirely-covered state where the liquid film covers the entire upper surface of the substrate after the processing liquid supplying step is started. The substrate rotational speed changing step includes a rotation accelerating step of increasing the rotational speed of the substrate when it is determined that the liquid film has the liquid breakage sign in the liquid breakage sign determining step.

With this method, when the liquid breakage sign indicating that the liquid film is going to break out from the entirely-covered state appears, the rotational speed of the substrate is increased. Thereby, the liquid film can be restored into the entirely-covered state. Therefore, since the entirely-covered state can be maintained, it is possible to uniformize the substrate processing.

In a preferred embodiment of the present invention, the substrate processing method further includes a processing liquid flow rate changing step of changing a flow rate of the processing liquid supplied to the substrate in accordance with the state of the liquid film monitored in the liquid film state monitoring step during execution of the processing liquid supplying step.

With this method, in accordance with the state of the liquid film on the upper surface of the substrate, not only the rotational speed of the substrate but also the flow rate of the processing liquid is changed. Thereby, the rotational speed of the substrate and the flow rate of the processing liquid can be respectively optimized in accordance with the state of the liquid film. Thus, it is possible to furthermore improve the uniformity of the substrate processing.

In a preferred embodiment of the present invention, the substrate processing method further includes an entirely-covered state determining step of determining whether or not it is an entirely-covered state where the liquid film monitored in the liquid film state monitoring step covers the entire upper surface of the substrate after the processing liquid supplying step is started. The processing liquid flow rate changing step includes a processing liquid reducing step of reducing the flow rate of the processing liquid when it is determined that it is the entirely-covered state in the entirely-covered state determining step.

As described above, a certain amount of time is required from the landing of the processing liquid on the substrate to the covering of the entire upper surface of the substrate, and by shortening this time, it is possible to uniformize the substrate processing.

Thus, when the supply of the processing liquid is started, the flow rate of the processing liquid is set to be relatively high, and when the entire upper surface of the substrate is covered with the liquid film of the processing liquid, the flow rate of the processing liquid is reduced. Thereby, a time from when the supply of the processing liquid is started to when the liquid film covering the entire upper surface of the substrate is formed can be shortened. Thus, it is possible to uniformize the substrate processing. Moreover, when the entire upper surface of the substrate is covered, the flow rate of the processing liquid is reduced. Thus, a consumption amount of the processing liquid can be suppressed. Thereby, while suppressing the consumption amount of the processing liquid, it is possible to uniformize the substrate processing.

In particular, furthermore preferably, when the supply of the processing liquid is started, the rotational speed is set to be relatively high, and the flow rate of the processing liquid is set to be relatively high. Preferably, when the entire upper surface of the substrate is covered with the liquid film of the processing liquid, the rotational speed of the substrate is reduced and the flow rate of the processing liquid is also reduced. Thereby, it is possible to furthermore improve the uniformity of the substrate processing and also reduce the consumption amount of the processing liquid.

In a preferred embodiment of the present invention, the substrate processing method further includes a liquid breakage sign determining step of determining whether or not the liquid film monitored in the liquid film state monitoring step has a liquid breakage sign to break out from the entirely-covered state where the liquid film covers the entire upper surface of the substrate after the processing liquid supplying step is started. The processing liquid flow rate changing step includes a processing liquid increasing step of increasing the flow rate of the processing liquid when it is determined that the liquid film has the liquid breakage sign in the liquid breakage sign determining step.

With this method, when the liquid breakage sign indicating that the liquid film is going to break out from the entirely-covered state appears, the flow rate of the processing liquid is increased. Thereby, the liquid film can be restored into the entirely-covered state. Therefore, since the entirely-covered state can be maintained, it is possible to uniformize the substrate processing.

Preferably, when the liquid breakage sign indicating that the liquid film is going to break out from the entirely-covered state appears, the rotation accelerating step of increasing the rotational speed of the substrate is executed, and the processing liquid increasing step of increasing the flow rate of the processing liquid is executed. Thereby, the liquid film can be reliably restored into the entirely-covered state. Thus, a state where the entire upper surface of the substrate is covered with the processing liquid can be reliably held, and it is possible to furthermore reliably realize highly uniform substrate processing.

In a preferred embodiment of the present invention, the processing liquid is an etching liquid. With this method, etching with high uniformity can be performed over the entire substrate. The "etching" includes the processing of removing part or all of the film on the substrate, and also includes the processing of cleaning the front surface of the substrate by utilizing an etching action of the processing liquid.

In a preferred embodiment of the present invention, the processing liquid is a rinse liquid. With this method, since rinsing processing with high uniformity can be performed over the entire substrate. Thus, it is possible to perform highly uniform substrate processing. For example, the rinsing processing may be performed after the front surface of the substrate is processed with the chemical liquid such as the etching liquid. In this case, by performing the rinsing processing with high uniformity over the entire substrate, chemical liquid processing can be uniformly stopped over the entire substrate. As a result, it is possible to achieve highly uniform substrate processing.

In particular, preferably, the rinsing processing (processing liquid supplying step) is performed while changing the rotational speed of the substrate (more preferably, further with a supply flow rate of the rinse liquid) in order to hold a state where the entire front surface of the substrate is covered with the liquid film of the rinse liquid. Thereby, the rinsing processing can be performed without generating a gas-liquid interface on the front surface of the substrate. Thus, it is possible to suppress or prevent contamination of the front surface of the substrate by foreign substances attracted to the gas-liquid interface. Therefore, it is possible to achieve high-quality and uniform substrate processing in which attachment of foreign substances (particles) is suppressed.

In a preferred embodiment of the present invention, the liquid film state monitoring step includes a liquid film image taking step of taking an image of the liquid film formed on the upper surface of the substrate, and an image analyzing step of analyzing the image of the liquid film taken in the liquid film image taking step.

With this method, the image of the liquid film formed on the upper surface of the substrate is taken, and by analyzing the consequently-obtained image, the state of the liquid film is monitored. Therefore, the state of the liquid film can be directly monitored. Thus, it is possible to properly optimize the rotational speed of the substrate (more preferably, further with a supply flow rate of the processing liquid) in a timely manner.

In a preferred embodiment of the present invention, the substrate has a front surface whose lyophilic level with respect to the processing liquid is changed by processing with the processing liquid. With this method, following the progress of the processing with the processing liquid, the lyophilic level of the front surface of the substrate is changed. For example, by removing the thin film on the front surface of the substrate by etching in a case where the processing liquid is the etching liquid, there is sometimes a case where a lyophilic (or lyophobic) front surface exhibited by the thin film is changed to a lyophobic (or lyophilic) front surface of an underlying layer exhibited by the thin film. In such a case, by changing the rotational speed of the substrate (more preferably, further with the supply flow rate of the processing liquid) in accordance with the state of the liquid film on the front surface of the substrate, the state of the liquid film on the front surface of the substrate can be held in an optimal state (specifically, the state where the entire upper surface of the substrate is covered). Thereby, it is possible to perform uniform processing on the front surface of the substrate without depending on a change in a state of the front surface of the substrate.

In a preferred embodiment of the present invention, the substrate processing method further includes a drying step of drying a liquid component on a front surface of the substrate after the processing liquid supplying step, and a dry state determining step of determining a dry state of the substrate based on the state of the liquid film monitored in the liquid film state monitoring step.

With this method, in the drying step, the state of the liquid film on the front surface of the substrate is monitored, and a dry state of the substrate is determined based on the monitoring. Therefore, in accordance with the dry state, the drying step can be properly controlled. For example, by properly controlling a supply amount of a fluid used in the drying step (such as a low surface tension liquid and an inert gas), a consumption amount of the fluid can be reduced. When it is determined that drying of the substrate is finished, by finishing the drying step based on the determination, it is possible to make the duration of the drying step as short as possible, and thereby, it is possible to enhance productivity of the substrate processing.

In a preferred embodiment of the present invention, the drying step includes an inert gas supplying step of supplying an inert gas to the front surface of the substrate, and an inert gas flow rate changing step of changing a flow rate of the inert gas based on determination of the dry state of the substrate in the dry state determining step.

With this method, in the drying step, the inert gas is supplied to the front surface of the substrate. At that time, the flow rate of the inert gas is changed in accordance with the dry state determined from the state of the liquid film on the front surface of the substrate. Therefore, for example, the inert gas can be supplied at a necessary and sufficient flow rate based on a change in the dry state. Thus, it is possible to reduce a consumption amount of the inert gas and also optimize the drying step.

For example, once the drying step is started, the liquid film on the front surface of the substrate becomes thinner, and the processing liquid on the front surface of the substrate is removed at the end. When a thin liquid film is formed on the front surface of the substrate, an interference pattern is observed. When the liquid film on the front surface of the substrate disappears, the interference pattern also disappears. Therefore, by observing the interference pattern, an end point of the drying step can be accurately detected. By reducing a supply flow rate of the inert gas or stopping discharge of the inert gas corresponding to the disappearance of the interference pattern, it is possible to reduce the consumption amount of the inert gas.

The present invention further provides a substrate processing apparatus including a substrate rotating unit that rotates a substrate in a horizontal posture, a processing liquid supplying unit that supplies a processing liquid to an upper surface of the substrate which is being rotated by the substrate rotating unit, a camera that takes an image of the processing liquid supplied to the upper surface of the substrate, and a controller that controls the substrate rotating unit and the processing liquid supplying unit based on the image taken by the camera. The controller is programmed to execute the steps of the substrate processing method having the characteristics described above.

The present invention further provides a recording medium on which a program to be executed by a computer provided in a substrate processing apparatus is recorded. The computer program incorporates execution steps to execute the substrate processing method having the above characteristics in the substrate processing apparatus. The recording medium may be an optical disk, a magnetic disk, etc., or may be a portable memory such as an USB memory and a memory card.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 shows an example of recipe data stored in a storage device for substrate processing.

FIG. 5(a) shows an example of changes in flow rates of an etching liquid, a rinse liquid, a low surface tension liquid, and an inert gas during the substrate processing. In addition, FIG. 5(b) shows an example of changes in rotational speed of a substrate during the substrate processing.

FIG. 6 shows an example of control of a supply flow rate of a processing liquid (the etching liquid and the rinse liquid) and the rotational speed of the substrate by a controller.

FIG. 11 is a flowchart for describing a specific example of determination processing of a liquid breakage sign (Steps S8 and S19 of FIG. 3A).

DETAILED DESCRIPTION OF THE PREFERRED EMBODIMENT

Figure 1:
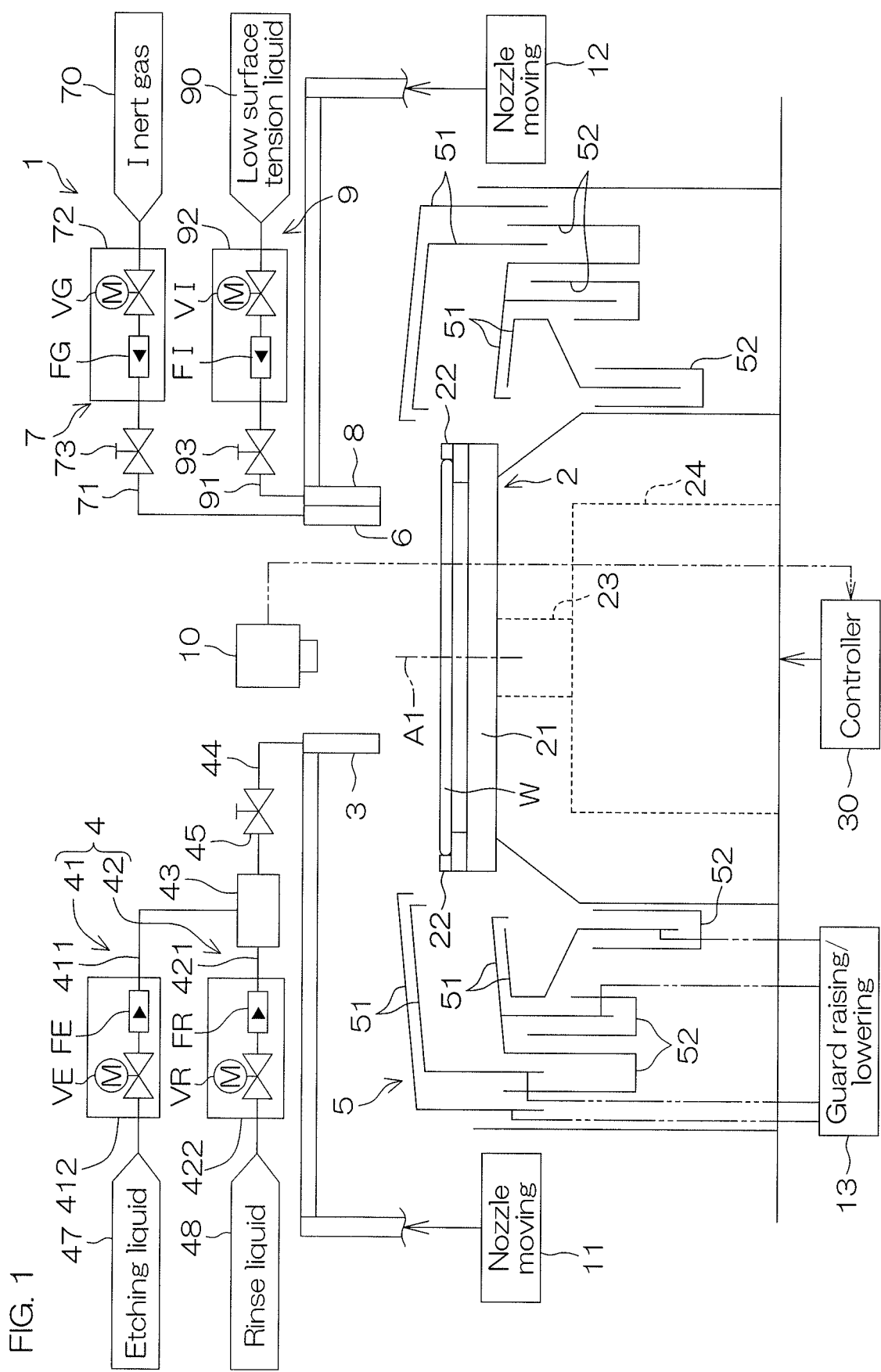
FIG. 1 is a concept view showing an arrangement of a substrate processing apparatus according to a preferred embodiment of the present invention.

FIG. 1 is a concept view showing an arrangement of a substrate processing apparatus according to a preferred embodiment of the present invention. A substrate processing apparatus 1 includes a spin chuck 2 serving as a substrate rotating unit that holds and rotates a substrate W in a horizontal posture, a processing liquid supplying unit 4 having a processing liquid nozzle 3 that supplies a processing liquid to the substrate W held by the spin chuck 2, and a processing cup 5 that encloses the spin chuck 2. The substrate processing apparatus 1 further includes an inert gas supplying unit 7 having an inert gas nozzle 6 that supplies an inert gas to the substrate W held by the spin chuck 2. The substrate processing apparatus 1 further includes a low surface tension liquid supplying unit 9 having a low surface tension liquid nozzle 8 that supplies a low surface tension liquid to the substrate W held by the spin chuck 2.

The processing nozzle 3 is moved between a processing position and a retreat position by a first nozzle moving unit 11. The processing position is a position where the processing liquid discharged from the processing liquid nozzle 3 lands on an upper surface of the substrate W held by the spin chuck 2, typically on the rotation center of the substrate W. The retreat position is a position where the processing nozzle 3 is arranged on the outside of the processing cup 5 in a plan view.

The inert gas nozzle 6 and the low surface tension liquid nozzle 8 are moved between a processing position and a retreat position by a second nozzle moving unit 12. The processing position is a position where the low surface tension liquid discharged from the low surface tension liquid nozzle 8 lands on the upper surface of the substrate W, typically on the rotation center of the substrate W. This processing position is also a position where an inert gas flow discharged from the inert gas nozzle 6 is directed to the upper surface of the substrate W held by the spin chuck 2, typically toward the rotation center of the substrate W. The retreat position is a position where the inert gas nozzle 6 and the low surface tension liquid nozzle 8 are arranged on the outside of the processing cup 5 in a plan view.

The spin chuck 2 includes a disk-shaped spin base 21, chuck pins 22 that stand at a peripheral edge portion of the spin base 21 to clamp the substrate W, a rotating shaft 23 arranged along the vertical direction to support the spin base 21 from the lower side, and a spin motor 24 that rotates the rotating shaft 23. By the spin motor 24 rotating the rotating shaft 23, the substrate W held by the spin chuck 2 is rotated around the vertical rotation axis A1. The spin chuck 2 is not limited to a mechanical chuck type in which the substrate W is clamped by the chuck pins 22 but may be a vacuum type in which a lower surface of the substrate W is sucked and held.

The processing cup 5 includes a splash guard 51 that opposes the substrate W held by the spin chuck 2 from the side and receives the processing liquid popping out of the substrate W in the horizontal direction, and a cup 52 that receives the processing liquid flowing downward after being received by the splash guard 51. The splash guard 51 is arranged so as to be raised and lowered with respect to the cup 52. In order to raise and lower the splash guard 51, a guard raising/lowering unit 13 is provided.

The processing liquid supplying unit 4 includes the processing liquid nozzle 3, an etching liquid supplying unit 41 that supplies an etching liquid (chemical liquid), a rinse liquid supplying unit 42 that supplies a rinse liquid, a mixing valve 43, a processing liquid piping 44, and an on/off valve 45. The processing liquid piping 44 is connected to the mixing valve 43 and the processing liquid nozzle 3, and forms a processing liquid flow passage between the mixing valve and the processing liquid nozzle. The on/off valve 45 is placed in the processing liquid piping 44. By opening/closing the on/off valve 45, the processing liquid can be discharged from the processing liquid nozzle 3 and the discharge can be stopped. The etching liquid supplying unit 41 and the rinse liquid supplying unit 42 are connected to the mixing valve 43.

The etching liquid supplying unit 41 includes an etching liquid piping 411 that guides the etching liquid supplied from an etching liquid supply source 47 to the mixing valve 43, and an etching liquid flow rate controller 412 placed in the etching liquid piping 411. The etching liquid flow rate controller 412 includes a flow rate meter FE and a flow rate control valve VE. The flow rate control valve VE includes an electric actuator, and has an arrangement in which an opening degree can be electrically controlled. As the etching liquid, in a case where an object to be subjected to etching is an oxidized film, hydrofluoric acid, fluonitric acid, and buffered hydrofluoric acid (fluoride acid-ammonium fluoride mixture) can be shown as examples. In a case where the object to be subjected to etching is a poly silicon film, ammonia water, SC1 (ammonia-hydrogen peroxide mixture), and TMAH (tetramethylammonium hydroxide solution) can be shown as examples. Further, in a case where the object to be subjected to etching is a metal film, hydrogen peroxide water, hydrochloric acid, SC1, SC2 (hydrochloric acid-hydrogen peroxide mixture), nitric acid, and SPM (sulfuric acid-hydrogen peroxide mixture) can be shown as examples.

The rinse liquid supplying unit 42 includes a rinse liquid piping 421 that guides the rinse liquid supplied from a rinse liquid supply source 48 to the mixing valve 43, and a rinse liquid flow rate controller 422 placed in the rinse liquid piping 421. The rinse liquid flow rate controller 422 includes a flow rate meter FR and a flow rate control valve VR. The flow rate control valve VR includes an electric actuator, and has an arrangement in which an opening degree can be electrically controlled. Examples of the rinse liquid include deionized water (DIW), carbonated water, electrolyzed ion water, hydrogen water, ozone water, and aqueous hydrochloric acid solution of dilute concentration (of, for example, approximately 10 ppm to 100 ppm).

With such an arrangement, the etching liquid can be supplied to the processing liquid nozzle 3 from the etching liquid supplying unit 41 via the mixing valve 43 and the on/off valve 45. The rinse liquid can be supplied to the processing liquid nozzle 3 from the rinse liquid supplying unit 42 via the mixing valve 43 and the on/off valve 45.

The inert gas supplying unit 7 includes the inert gas nozzle 6, an inert gas piping 71 that guides the inert gas from an inert gas supply source 70 to the inert gas nozzle 6, an inert gas flow rate controller 72 placed in the inert gas piping 71, and an on/off valve 73 similarly placed in the inert gas piping 71. The inert gas flow rate controller 72 includes a flow rate meter FG that measures a flow rate of the inert gas flowing through the inert gas piping 71, and a flow rate control valve VG that adjusts the flow rate. The flow rate control valve VG includes an electric actuator, etc., and has an arrangement in which the flow rate can be electrically controlled. The inert gas is a chemically inert gas with respect to constituent materials of the substrate W, and may be a nitrogen gas, dry air, etc.

The low surface tension liquid supplying unit 9 includes the low surface tension liquid nozzle 8, a low surface tension liquid piping 91 that guides the low surface tension liquid from a low surface tension liquid supply source 90 to the low surface tension liquid nozzle 8, a low surface tension liquid flow rate controller 92 placed in the low surface tension liquid piping 91, and an on/off valve 93 similarly placed in the low surface tension liquid piping 91. The low surface tension liquid flow rate controller 92 includes a flow rate meter FI that measures a flow rate of the low surface tension liquid flowing through the low surface tension liquid piping 91, and a flow rate control valve VI that adjusts the flow rate.

The flow rate control valve VI includes an electric actuator, etc., and has an arrangement in which the flow rate can be electrically controlled. The low surface tension liquid is a liquid whose surface tension is smaller than the rinse liquid (typically, water), and an organic solvent such as isopropyl alcohol is a typical example. In particular, an organic solvent replaceable with the rinse liquid is preferable, and more specifically, a hydrophilic organic solvent is preferable. As such an organic solvent, isopropyl alcohol (IPA), methanol, ethanol, butanol, acetone, PGMEA (propylene glycol monomethyl ether acetate), EGMEA (ethylene glycol monoethyl ether acetate), etc., can be shown as examples.

In order to monitor a state of the upper surface of the substrate W, in particular, a state of a liquid film of the processing liquid formed on the upper surface, a camera 10 is provided. The camera 10 takes an image of an imaging region including the upper surface of the substrate W, in particular, a peripheral edge region of the substrate W.

Figure 2:
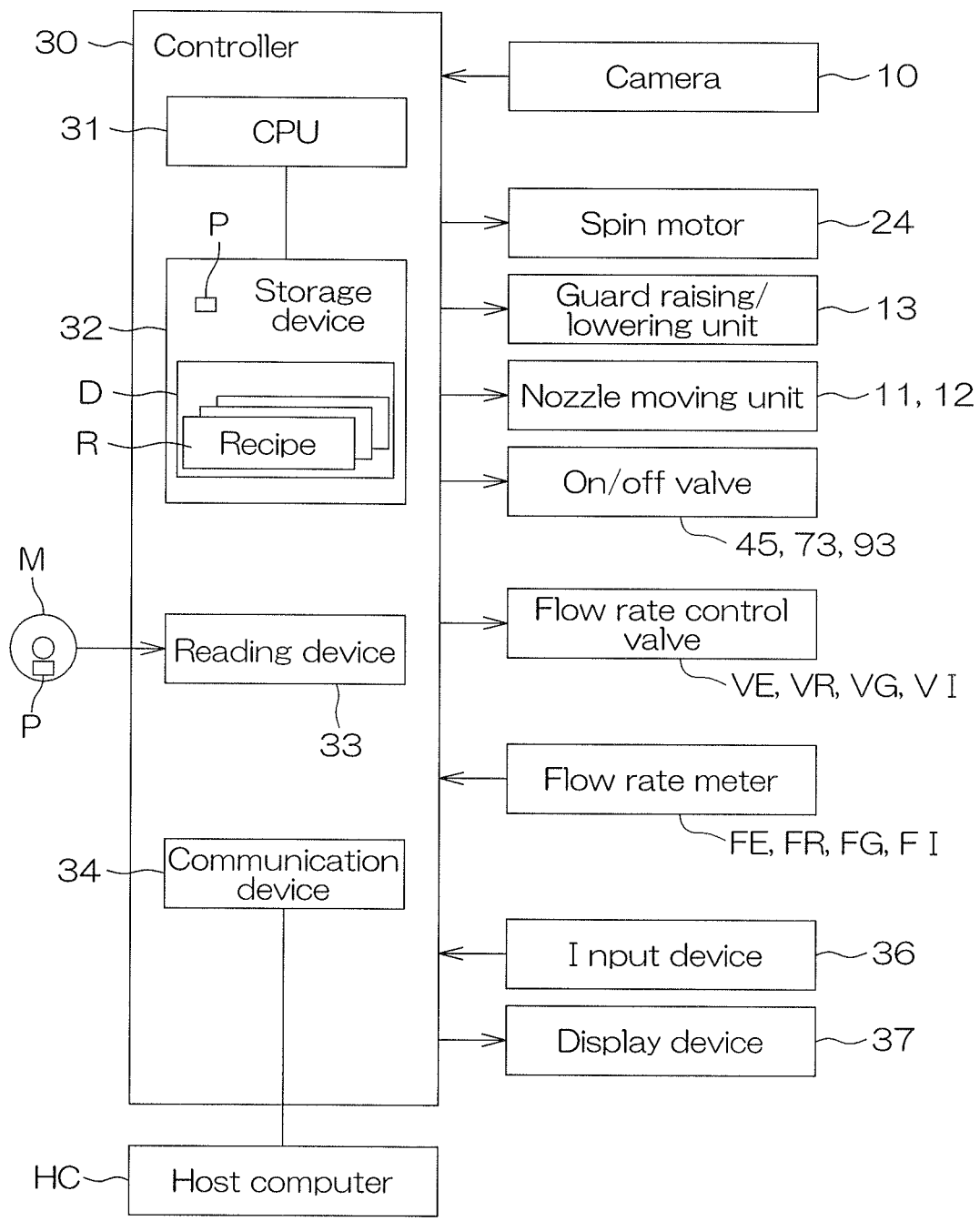
FIG. 2 is a block diagram showing an electrical configuration of the substrate processing apparatus.

FIG. 2 is a block diagram showing an electrical configuration of the substrate processing apparatus 1. The substrate processing apparatus 1 includes a controller 30. The controller 30 controls actions of the spin motor 24, the guard raising/lowering unit 13, the first and second nozzle moving units 11, 12, the on/off valves 45, 73, 93, the flow rate control valves VE, VR, VG, VI, etc. Flow rate values measured by the flow rate meters FE, FR, FG, FI are input to the controller 30. Image data of images taken by the camera 10 are also input to the controller 30.

The controller 30 has a basic configuration as a computer. More specifically, the controller 30 includes a processor (CPU) 31, a storage device 32, a reading device 33, and a communication device 34.

The storage device 32 may be a semiconductor memory, a magnetic storage device, etc. A program P (computer program) to be executed by the processor 31 is stored in the storage device 32. The program P may be read from a removable medium M such as an optical disk or a memory card via the reading device 33 and introduced to the storage device 32. The program P may be acquired by communication via the communication device 34 and introduced to the storage device 32. The storage device 32 and the removable medium M are examples of a recording medium from which reading can be made by the computer. In addition to the program P, various data D are stored in the storage device 32. An example of the stored data D is recipe data R for substrate processing. The recipe data R may be acquired from an external host computer HC via the communication device 34. The recipe data R is data representing information (recipe) regulating processing content, processing conditions, and processing procedures of the substrate W. Steps of the substrate processing are respectively realized by the controller 30 controlling the substrate processing apparatus 1 according to the recipe data R. That is, the controller 30 is programmed to execute the respective steps of the substrate processing.

An input device 36 and a display device 37 are connected to the controller 30. The input device 36 is a device for an operator operating and inputting a command to the controller 30, such as a keyboard and a pointing device. The display device 37 is typically formed by a two-dimensional display such as a liquid crystal display device, and visually provides various pieces of information to the operator. The input device 36 and the display device 37 provide a man-machine interface to the controller 30.

Figure 3A:
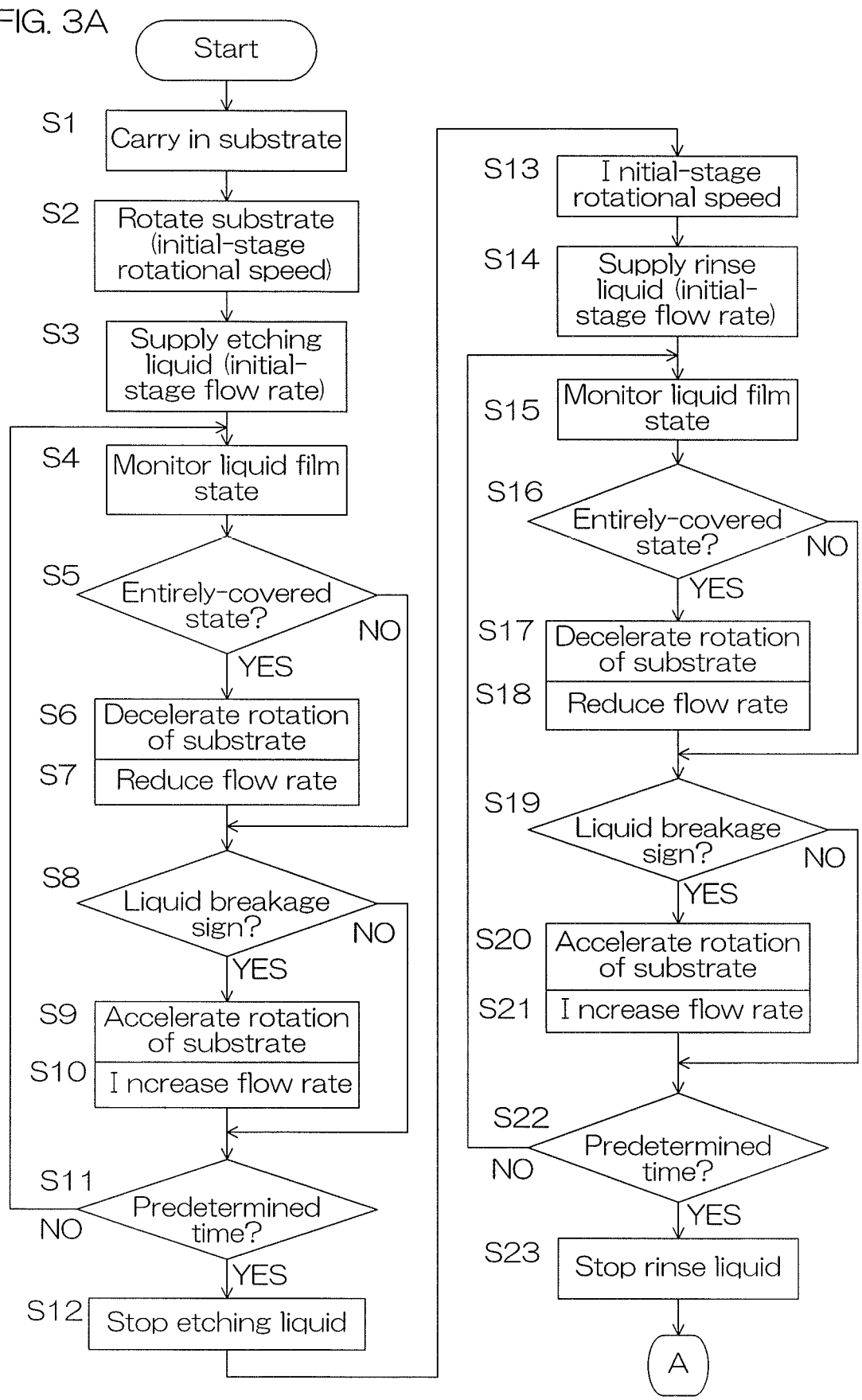
FIG. 3A is a flowchart for describing an outline of a substrate processing example (an etching step and a rinsing step) by the substrate processing apparatus.
Figure 3B:
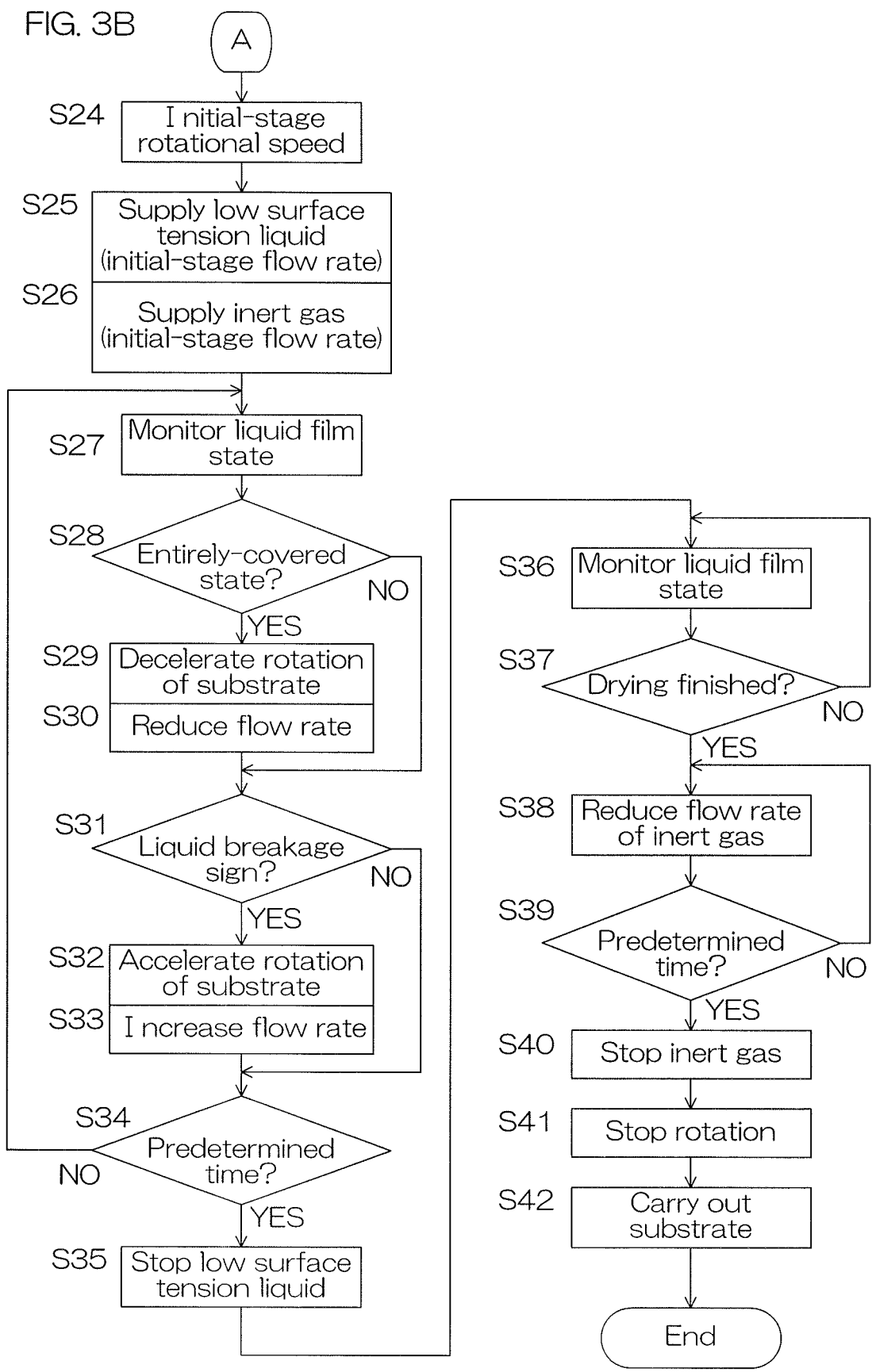
FIG. 3B is a flowchart for describing an outline of a substrate processing example (drying step) by the substrate processing apparatus.

FIG. 3A and FIG. 3B are flowcharts for describing outlines of substrate processing examples by the substrate processing apparatus 1. The controller 30 executes the following substrate processing by controlling portions of the substrate processing apparatus 1 according to the program.

A single substrate W to be subjected to processing is carried into a processing unit by a hand of a substrate transfer robot (not shown) (Step S1).

The substrate W may be a silicon substrate in which a silicon oxide film is formed on a front surface (upper surface). Etching processing (chemical liquid processing) for removing the silicon oxide film is performed on the substrate W. An etching liquid used in this case may be hydrofluoric acid solution. The front surface of the substrate W on which the silicon oxide film is formed, that is, a front surface of the silicon oxide film takes on a hydrophilic surface. Therefore, even when a supply flow rate of the processing liquid (the etching liquid or the rinse liquid) is low, or even when rotational speed of the substrate W is low, the processing liquid spreads on the upper surface of the substrate W and the liquid film of the processing liquid covering the entire upper surface of the substrate W can be formed. When the silicon oxide film is removed and a silicon layer is exposed, on the other hand, the front surface of the substrate W, that is, a front surface of the silicon layer takes on a hydrophobic surface. Therefore, in order to form the liquid film of the processing liquid covering the entire upper surface of the substrate W, at least, there is a need for increasing the rotational speed of the substrate W, and further, preferably, the supply flow rate of the processing liquid is increased together.

When the substrate W is carried in and delivered to the spin chuck 2 and the hand of the substrate transfer robot is retreated, the controller 30 drives the spin motor 24 and rotates the substrate W at etching initial-stage rotational speed (Step S2: a substrate rotating step). The etching initial-stage rotational speed is selected to be relatively high, and may be, for example, approximately 800 rpm to 1,200 rpm.

In a state where the substrate W is rotated at the etching initial-stage rotational speed, the controller 30 supplies the etching liquid from the processing liquid nozzle 3 to the upper surface of the substrate W (Step S3: a processing liquid supplying step). More specifically, the controller 30 controls the guard raising/lowering unit 13 and allows the splash guard 51 to oppose a peripheral end surface of the substrate W. Further, the controller 30 arranges the processing liquid nozzle 3 at the processing position by controlling the first nozzle moving unit 11. In this state, by controlling the etching liquid supplying unit 41 and opening the on/off valve 45, the controller 30 performs a control to discharge the etching liquid toward the upper surface of the substrate W from the processing liquid nozzle 3 at an initial-stage etching flow rate. The initial-stage etching flow rate is set to be relatively high, and may be, for example, 1.5 liters/min to 2.5 liters/min. The controller 30 controls the flow rate control valve VE while monitoring an etching liquid flow rate measured by the flow meter FE of the etching liquid supplying unit 41, and thereby, feedback-controls the etching liquid flow rate.

Since the etching initial-stage rotational speed is set within a high rotation region and the initial-stage etching flow rate is set within a high flow rate region, the etching liquid landing on center of the upper surface of the substrate W promptly spreads over the entire upper surface of the substrate W and forms a liquid film covering the entire upper surface.

An image of the state of the liquid film formed on the upper surface of the substrate W is taken by the camera 10, and image data output by the camera 10 is input to the controller 30 (a liquid film image taking step). By analyzing the image data output by the camera 10 (an image analyzing step), the controller 30 monitors the state of the liquid film (Step S4: a liquid film state monitoring step).

The controller 30 changes the rotational speed of the substrate W in accordance with the state of the liquid film. Further, the controller 30 changes a supply flow rate of the etching liquid in accordance with the state of the liquid film.

More specifically, when the liquid film is stable in an entirely-covered state where the liquid film covers the entire upper surface of the substrate W (YES in Step S5: an entirely-covered state determining step), the controller 30 reduces the rotational speed of the substrate W (Step S6: a substrate rotational speed changing step and a rotation decelerating step). Thereby, linear speed of each portion of the substrate W according to rotation of the substrate W is reduced, and in particular, a temperature decrease of the etching liquid according to liquid evaporation in a peripheral edge portion of the substrate W is suppressed. Further, when the liquid film is stable in the entirely-covered state where the liquid film covers the entire upper surface of the substrate W (YES in Step S5: the entirely-covered state determining step), the controller 30 reduces the supply flow rate of the etching liquid (Step S7: a processing liquid flow rate changing step and a processing liquid reducing step). Thereby, without losing uniformity of the substrate processing, a consumption amount of the etching liquid is reduced.

The controller 30 further monitors whether or not there is a sign (liquid breakage sign) indicating that the liquid film is going to break out from the entirely-covered state where the liquid film covers the entire upper surface of the substrate W based on the image taken by the camera 10 (Step S8: a liquid breakage sign determining step). When such a sign appears (YES in Step S8), the controller 30 increases the rotational speed of the substrate W (Step S9: a substrate rotational speed changing step and a rotation accelerating step) and stabilizes the entirely-covered state. When the liquid breakage sign appears (YES in Step S8), the controller 30 increases the supply flow rate of the etching liquid (Step S10: a processing liquid flow rate changing step and a processing liquid increasing step) and stabilizes the entirely-covered state.

In such a way, in accordance with the state of the liquid film on the substrate W, the rotational speed of the substrate W and the supply flow rate of the etching liquid are variably controlled and optimized during a period of an etching step (processing liquid supplying step) in which the etching liquid is supplied.

After the etching liquid is supplied over a predetermined time (YES in Step S11), the controller 30 controls the etching liquid supplying unit 41 and stops discharge of the etching liquid from the processing liquid nozzle 3 (Step S12).

Next, the controller 30 executes a rinsing step to wash the etching liquid away from the substrate W. More specifically, the controller 30 controls the spin motor 24 and rotates the substrate W at a rinsing initial-stage rotational speed (Step S13: a substrate rotating step). The rinsing initial-stage rotational speed may be, for example, 800 rpm to 1,200 rpm. Further, by arranging the processing liquid nozzle 3 at the processing position and controlling the rinse liquid supplying unit 42 in a state where the on/off valve 45 is opened, the controller 30 discharges the rinse liquid toward the upper surface of the substrate W from the processing liquid nozzle 3 at an initial-stage rinsing flow rate (Step S14: a processing liquid supplying step). Preferably, stop of the etching liquid and supply of the rinse liquid are continuously performed, and thereby, a state where the upper surface of the substrate W is covered with the processing liquid can be maintained. The initial-stage rinsing flow rate is set to be relatively high, and may be, for example, 1.5 liters/min to 2.5 liters/min. The controller 30 controls the flow rate control valve VR while monitoring a rinse liquid flow rate measured by the flow meter FR of the rinse liquid supplying unit 42, and thereby, feedback-controls the rinse liquid flow rate.

Since the rinsing initial-stage rotational speed is set within a high rotation region and the initial-stage rinsing flow rate is set within a high flow rate region, the rinse liquid landing on the center of the upper surface of the substrate W promptly spreads over the upper surface of the substrate W. Thereby, the rinse liquid forms a liquid film covering the entire upper surface of the substrate W and promptly replaces the etching liquid over the entire upper surface of the substrate W. Thereby, etching is stopped substantially at the same time over the entire upper surface of the substrate W.

Similar to the case of the etching step, an image of a state of the liquid film formed on the upper surface of the substrate W is taken by the camera 10, and image data output by the camera 10 is input to the controller 30 (a liquid film image taking step). By analyzing the image data output by the camera 10 (an image analyzing step), the controller 30 monitors the state of the liquid film (Step S15: a liquid film state monitoring step).

The controller 30 changes the rotational speed of the substrate Win accordance with the state of the liquid film even in the rinsing step. Further, the controller 30 changes a supply flow rate of the rinse liquid in accordance with the state of the liquid film.

More specifically, when the liquid film is stable in the entirely-covered state where the liquid film covers the entire upper surface of the substrate W (YES in Step S16: an entirely-covered state determining step), the controller 30 reduces the rotational speed of the substrate W (Step S17: a substrate rotational speed changing step and a rotation decelerating step). Thereby, the linear speed of each portion of the substrate W according to the rotation of the substrate W is reduced. Thus, a temperature difference between the vicinity of the center where the linear speed is low and a peripheral edge part where the linear speed is high can be suppressed. Further, when the liquid film is stable in the entirely-covered state where the liquid film covers the entire upper surface of the substrate W (YES in Step S16: the entirely-covered state determining step), the controller 30 reduces the supply flow rate of the rinse liquid (Step S18: a processing liquid flow rate changing step and a processing liquid reducing step). Thereby, while rinsing processing progresses uniformly over the entire upper surface of the substrate, a consumption amount of the rinse liquid is reduced.

The controller 30 further monitors whether or not there is a sign (liquid breakage sign) indicating that the liquid film is going to break out from the entirely-covered state where the liquid film covers the entire upper surface of the substrate W based on the image taken by the camera 10 (Step S19: a liquid breakage sign determining step). When the liquid breakage sign appears (YES in Step S19), the controller 30 increases the rotational speed of the substrate W (Step S20: a substrate rotational speed changing step and a rotation accelerating step) and stabilizes the entirely-covered state. When the liquid breakage sign appears (YES in Step S19), the controller 30 increases the supply flow rate of the rinse liquid (Step S21: a processing liquid flow rate changing step and a processing liquid increasing step) and stabilizes the entirely-covered state.

In such a way, in accordance with the state of the liquid film on the substrate W, the rotational speed of the substrate W and the supply flow rate of the rinse liquid are also variably controlled and optimized during a period of the rinsing step (processing liquid supplying step) in which the rinse liquid is supplied.

After the rinse liquid is supplied over a predetermined time (Step S22), the controller 30 controls the rinse liquid supplying unit 42 and stops the supply of the rinse liquid, and closes the on/off valve 45 and stops discharge of a liquid from the processing liquid nozzle 3 (Step S23). Further, the controller 30 controls the first nozzle moving unit 11 and moves the processing nozzle 3 to the retreat position.

Then, as shown in FIG. 3B, the controller 30 starts a drying step. That is, the controller 30 controls the second nozzle moving unit 12 and moves the low surface tension liquid nozzle 8 and the inert gas nozzle 6 to the processing position opposing the vicinity of the center of the upper surface of the substrate W. In the present preferred embodiment, the drying step includes a low surface tension liquid replacing step of supplying a low surface tension liquid to the upper surface of the substrate W and replacing the rinse liquid with the low surface tension liquid, and a liquid film removing step of supplying an inert gas to the upper surface of the substrate W and removing the liquid on the substrate W. An execution period of the low surface tension liquid replacing step may partially overlap with an execution period of the liquid film removing step. More specifically, while the low surface tension liquid replacing step is performed in the first half of a drying period, the liquid film removing step may be performed over the entire period of the drying step.

Upon start of the drying step, the controller 30 controls the spin motor 24 and rotates the substrate W at a drying initial-stage rotational speed (Step S24: a substrate rotating step). The drying initial-stage rotational speed may be, for example, 800 rpm to 2,000 rpm.

In the low surface tension liquid replacing step, the controller 30 controls the low surface tension liquid flow rate controller 92 and the on/off valve 93 and discharges the low surface tension liquid toward the rotation center of the substrate W (Step S25: a processing liquid supplying step). Preferably, stop of the rinse liquid and supply of the low surface tension liquid are continuously performed. Thereby, the state where the upper surface of the substrate W is covered with the processing liquid can be maintained. An initial-stage low surface tension liquid flow rate is set to be relatively high, and may be, for example, 1.5 liters/min to 2.5 liters/min. The controller 30 controls the flow rate control valve VI while monitoring a low surface tension liquid flow rate measured by the flow meter FI of the low surface tension liquid supplying unit 9, and thereby, feedback-controls the low surface tension liquid flow rate.

Since the drying initial-stage rotational speed is set within a high rotation region and the initial-stage low surface tension liquid flow rate is set within a high flow rate region, the low surface tension liquid landing on the center of the upper surface of the substrate W promptly spreads over the upper surface of the substrate W. Thereby, the low surface tension liquid forms a liquid film covering the entire upper surface of the substrate W and promptly replaces the rinse liquid over the entire upper surface of the substrate W.

Similar to the cases of the etching step and the rinsing step, an image of a state of the liquid film formed on the upper surface of the substrate W is taken by the camera 10, and image data output by the camera 10 is input to the controller 30 (a liquid film image taking step). By analyzing the image data output by the camera 10 (an image analyzing step), the controller 30 monitors the state of the liquid film (Step S27: a liquid film state monitoring step).

The controller 30 changes the rotational speed of the substrate W in accordance with the state of the liquid film even in the low surface tension liquid replacing step. Further, the controller 30 changes a supply flow rate of the low surface tension liquid in accordance with the state of the liquid film.

More specifically, when the liquid film is stable in the entirely-covered state where the liquid film covers the entire upper surface of the substrate W (YES in Step S28: an entirely-covered state determining step), the controller 30 reduces the rotational speed of the substrate W (Step S29: a substrate rotational speed changing step and a rotation decelerating step). Thereby, the linear speed of each portion of the substrate W according to the rotation of the substrate W is reduced. Thus, the temperature difference between the vicinity of the center where the linear speed is low and the peripheral edge part where the linear speed is high can be suppressed. Further, when the liquid film is stable in the entirely-covered state where the liquid film covers the entire upper surface of the substrate W (YES in Step S28: the entirely-covered state determining step), the controller 30 reduces the supply flow rate of the low surface tension liquid (Step S30: a processing liquid flow rate changing step and a processing liquid reducing step). Thereby, while low surface tension liquid replacing processing progresses uniformly over the entire upper surface of the substrate, a consumption amount of the low surface tension liquid is reduced.

The controller 30 further monitors whether or not there is a sign (liquid breakage sign) indicating that the liquid film is going to break out from the entirely-covered state where the liquid film covers the entire upper surface of the substrate W based on the image taken by the camera 10 (Step S31: a liquid breakage sign determining step). When the liquid breakage sign appears (YES in Step S31), the controller 30 increases the rotational speed of the substrate W (Step S32: a substrate rotational speed changing step and a rotation accelerating step) and stabilizes the entirely-covered state. When the liquid breakage sign appears (YES in Step S31), the controller 30 increases the supply flow rate of the low surface tension liquid (Step S33: a processing liquid flow rate changing step and a processing liquid increasing step) and stabilizes the entirely-covered state.

In such a way, in accordance with the state of the liquid film on the substrate W, the rotational speed of the substrate W and the supply flow rate of the low surface tension liquid are variably set and optimized during a period of the low surface tension liquid replacing step (processing liquid supplying step) in which the low surface tension liquid is supplied.

After the low surface tension liquid replacing step over a predetermined time is finished (YES in Step S34), the controller 30 closes the on/off valve 93 and stops discharge of the low surface tension liquid (Step S35).

In order to execute the liquid film removing step, the controller 30 controls the inert gas flow rate controller 72 and the on/off valve 73 and discharges the inert gas toward the upper surface of the substrate W (Step S26: an inert gas supplying step). This discharge of the inert gas may be started at the same time as the low surface tension liquid replacing step, may be started before that, or may be started during execution of the low surface tension liquid replacing step. The low surface tension liquid on the substrate W is pushed outward by the inert gas, and shaken off to the outside of the substrate W by a centrifugal force. Therefore, after the supply of the low surface tension liquid is stopped (Step S35), the low surface tension liquid on the substrate W is promptly reduced.

During the liquid film removing step, the controller 30 takes in the image data output by the camera 10 (a liquid film image taking step), analyzes the image (image analyzing step), and monitors a progress of the drying step (Step S36: a liquid film state monitoring step). More specifically, since the low surface tension liquid on the substrate W is removed by the centrifugal force by the rotation of the substrate W, the liquid film on the substrate W is thinned, and an interference pattern appears in the image taken by the camera 10. When the liquid film on the substrate W is eliminated by the rotation of the substrate W and supply of the inert gas, the interference pattern in the image disappears. Then, the controller 30 executes processing to recognize disappearance of the interference pattern by image analysis (image analyzing step). Thereby, the controller 30 is able to determine an end point of substrate drying. When the end point of the substrate drying is observed (YES in Step S37: a dry state determining step), the controller 30 reduces the supply of the inert gas (Step S38: an inert gas flow rate changing step). After a predetermined time set for the drying step elapses (YES in Step S39), the controller 30 closes the on/off valve 73 and stops the supply of the inert gas (Step S40), stops the rotation of the substrate W (Step S41), and finishes the drying step.

When the drying step is finished, the controller 30 controls the guard raising/lowering unit 13 and lowers the splash guard 51 to a height not opposing the peripheral end surface of the substrate W. The controller 30 further controls the second nozzle moving unit 12 and retreats the inert gas nozzle 6 to the retreat position. The controller 30 then controls the substrate transfer robot and allows the hand to carry the processed substrate W out of the spin chuck 2 (Step S42).

FIG. 4 shows an example of the recipe data R stored in the storage device 32 for the substrate processing described above. Recipes expressed by the recipe data R include step numbers 401 given according to the step order, contents 402 of the steps, designated positions 403 (guard position) of the splash guard 51 in the steps, designated substrate rotational speeds 404 in the steps, designated nozzle positions 405 in the steps, fluids 406 to be supplied in the steps, designated flow rates 407 of the supplied fluids, and designated execution times 408 of the steps.

In the example of FIG. 4, Steps 1 to 9 are a guard raising step, a substrate rotating step, a nozzle moving step, a chemical liquid processing step, a rinsing processing step, a nozzle moving step, a spin-drying step, a substrate rotation stopping step, and a guard lowering step, respectively.

The guard raising step (Step 1) is a step of raising the splash guard 51 to a processing position opposing the peripheral end surface of the substrate W. After this, up to the substrate rotation stopping step (Step 8), the guard is held at the processing position. The designated substrate rotational speed in the guard raising step is 0 rpm, the designated nozzle position is a home position (retreat position), no fluid to be supplied is designated, and therefore, the designated flow rate is 0 liters/min. The designated execution time is set to be a time necessary and sufficient for raising the splash guard 51.

The substrate rotating step (Step 2) is a step of starting the rotation of the substrate W, that is, rotation of the spin chuck 2. Rotational speed of the spin chuck 2 is accelerated to 1,000 rpm as the designated substrate rotational speed. The designated nozzle position is the home position (retreat position). No fluid to be supplied is designated, and therefore, the designated flow rate is 0 liters/min. The designated execution time is set to be a time necessary and sufficient for accelerating the rotation of the substrate to the designated substrate rotational speed.

The nozzle moving step (Step 3) is a step of moving the processing liquid nozzle 3 to the center of the substrate (processing position) by the first nozzle moving unit 11. The designated substrate rotational speed is held at 100 rpm, and the designated nozzle position is the center of the substrate (processing position). No fluid to be supplied is designated, and therefore, the designated flow rate is 0 liters/min. The designated execution time is set to be a time necessary and sufficient for moving the processing liquid nozzle 3 from the home position to the center of the substrate.

The chemical liquid processing step (Step 4) is a step of discharging a chemical liquid (etching liquid) from the processing liquid nozzle 3 toward the substrate W. The designated substrate rotational speed is designated within a range from 100 rpm to 2,000 rpm. That is, the controller 30 discharges the etching liquid from the processing liquid nozzle 3 while variably setting the rotational speed of the spin chuck 2 within the range from 100 rpm to 2,000 rpm in accordance with the state of the liquid film on the upper surface of the substrate. The designated nozzle position is the center of the substrate (processing position), and supply of the chemical liquid (etching liquid) is designated. The designated flow rate is designated within a range from 0.5 liters/min to 2.0 liters/min. That is, the controller 30 discharges the etching liquid from the processing liquid nozzle 3 while variably setting the flow rate of the etching liquid within the range from 0.5 liters/min to 2.0 liters/min in accordance with the state of the liquid film on the upper surface of the substrate. The designated execution time is set to be a time necessary and sufficient for the etching processing performed on the upper surface of the substrate.

The rinsing processing step (Step 5) is a step of discharging the rinse liquid from the processing liquid nozzle 3 toward the substrate W. The designated substrate rotational speed is designated within a range from 100 rpm to 2,000 rpm. That is, the controller 30 discharges the rinse liquid from the processing liquid nozzle 3 while variably setting the rotational speed of the spin chuck 2 within the range from 100 rpm to 2,000 rpm in accordance with the state of the liquid film on the upper surface of the substrate. The designated nozzle position is the center of the substrate (processing position), and supply of the rinse liquid is designated. The designated flow rate is designated within a range from 0.5 liters/min to 2.0 liters/min. That is, the controller 30 discharges the rinse liquid from the processing liquid nozzle 3 while variably setting the flow rate of the rinse liquid within the range from 0.5 liters/min to 2.0 liters/min in accordance with the state of the liquid film on the upper surface of the substrate. The designated execution time is set to be a time necessary and sufficient for replacing all the etching liquid on the upper surface of the substrate with the rinse liquid.

The nozzle moving step (Step 6) is a step of retreating the processing liquid nozzle 3 to the home position (retreat position) by the first nozzle moving unit 11 while moving the low surface tension liquid nozzle 8 and the inert gas nozzle 6 from the retreat position (home position) to the center of the substrate (processing position) by the second nozzle moving unit 12. The designated substrate rotational speed is designated within a range from 100 rpm to 2,000 rpm. That is, the controller 30 performs a nozzle moving action while properly setting the rotational speed of the spin chuck 2 within the range from 100 rpm to 2,000 rpm so that the liquid film of the rinse liquid on the upper surface of the substrate can be held. The designated nozzle position is the center of the substrate (processing position), and this designates a position of the low surface tension liquid nozzle 8 and the inert gas nozzle 6. No fluid to be supplied is designated, and therefore, the designated flow rate is 0 liters/min. The designated execution time is set to be a time necessary and sufficient for moving the processing liquid nozzle 3 and moving the low surface tension liquid nozzle 8 and the inert gas nozzle 6.

The spin-drying step (Step 7) corresponds to the drying step. The designated nozzle position is the center of the substrate (processing position), and this designates the positions of the low surface tension liquid nozzle 8 and the inert gas nozzle 6. As the fluid to be supplied, a solvent (an example of the low surface tension liquid) and a nitrogen gas (an example of the inert gas) are designated. The designated substrate rotational speed is designated within a range from 100 rpm to 2,000 rpm. That is, the controller 30 supplies the low surface tension liquid and the inert gas while variably setting the rotational speed of the spin chuck 2 within the range from 100 rpm to 2,000 rpm in accordance with the state of the liquid film (liquid film of the low surface tension liquid) on the upper surface of the substrate. The designated flow rate is designated for the solvent within a range from 0.1 liters/min to 5.0 liters/min, and for the nitrogen gas within a range from 50 liters/min to 100 liters/min. That is, in accordance with the state of the liquid film (liquid film of the low surface tension liquid) on the upper surface of the substrate, the controller 30 performs the low surface tension liquid replacing step while variably setting a flow rate of the solvent within the range from 0.1 liters/min to 5.0 liters/min, and performs the inert gas supplying step while variably setting a flow rate of the nitrogen gas within the range from 50 liters/min to 100 liters/min. The designated execution time is set to be a time necessary and sufficient for completely removing the low surface tension liquid on the upper surface of the substrate.

The substrate rotation stopping step (Step 8) is a step of stopping the rotation of the substrate W, that is, the rotation of the spin chuck 2. The rotational speed of the spin chuck 2 is decelerated to 0 rpm as the designated substrate rotational speed, and thereby, the rotation of the substrate W is stopped. The designated nozzle position is the home position (retreat position). That is, the low surface tension liquid nozzle 8 and the inert gas nozzle 6 are moved to the home position (retreat position) by the second nozzle moving unit 12. No fluid to be supplied is designated, and therefore, the designated flow rate is 0 liters/min. The designated execution time is set to be a time necessary and sufficient for stopping the rotation of the substrate and moving the nozzles.

The guard lowering step (Step 9) is a step of lowering the splash guard 51 to the home position (retreat position) in preparation for carry-out of the processed substrate W. The designated substrate rotational speed is 0 rpm, and the designated nozzle position is the home position (retreat position). No fluid to be supplied is designated, and therefore, the designated flow rate is 0 liters/min. The designated execution time is set to be a time necessary and sufficient for lowering the splash guard 51.

The controller 30 executes such Steps 1 to 9 sequentially. Thereby, the substrate processing shown in FIG. 3A and FIG. 3B is realized.

FIG. 5(a) shows an example of changes in the flow rates of the etching liquid, the rinse liquid, the low surface tension liquid, and the inert gas during the substrate processing. FIG. 5(b) shows an example of changes in the rotational speed of the substrate during the substrate processing.

At an initial stage of the etching step, a relatively high initial-stage etching flow rate is set, and relatively high etching initial-stage rotational speed is set. Thereby, the liquid film of the etching liquid covering the entire upper surface of the substrate can be promptly formed, and the etching processing can be started substantially at the same time over the entire upper surface of the substrate. In a state where the liquid film of the etching liquid covers the entire upper surface of the substrate, the flow rate of the etching liquid is reduced as shown by a reference symbol 111, and the rotational speed of the substrate W is reduced as shown by a reference symbol 121. Thereby, the consumption amount of the etching liquid is reduced, and a temperature of the liquid film on the substrate W is uniformized. Thus, etching can uniformly progress over the entire surface of the substrate W with a low flow rate of the etching liquid.

While the front surface of the substrate W is covered with the silicon oxide film, the front surface of the substrate is a hydrophilic surface. Thus, as shown by reference symbols 112, 122, by supplying the etching liquid at a low flow rate and rotating the substrate W at a low rotational speed, the entirely-covered state where the entire upper surface of the substrate W is covered with the liquid film of the etching liquid can be maintained. When etching of the silicon oxide film progresses and the silicon layer of the substrate W is exposed, the front surface of the substrate takes on a hydrophobic surface. Then, the sign indicating that the liquid film on the upper surface of the substrate W is going to break out from the entirely-covered state, that is, the liquid breakage sign appears. When the liquid breakage sign appears, as shown by reference symbols 113, 123, the flow rate of the etching liquid is increased and the rotational speed of the substrate W is accelerated.

After the etching liquid is supplied over a time regulated by the recipe, the etching step is finished and the rinsing step is started.

At an initial stage of the rinsing step, a relatively high initial-stage rinsing flow rate is set, and relatively high rinsing initial-stage rotational speed is set. Thereby, the liquid film of the rinse liquid covering the entire upper surface of the substrate can be promptly formed, and the etching liquid can be replaced with the rinse liquid substantially at the same time over the entire upper surface of the substrate. Thereby, etching can be stopped substantially at the same time over the entire upper surface of the substrate. In a state where the liquid film of the rinse liquid covers the entire upper surface of the substrate, the flow rate of the rinse liquid is reduced as shown by a reference symbol 114. Although the rotational speed of the substrate is not changed in the example of FIG. 5(b), the rotational speed of the substrate W may be reduced in addition to reduction in the flow rate of the rinse liquid. Thereby, the consumption amount of the rinse liquid is reduced, and the temperature of the liquid film on the substrate W is uniformized. Thus, the rinsing processing can uniformly progress over the entire surface of the substrate W with a low flow rate of the rinse liquid. In the rinsing step, since the entire upper surface of the substrate is always covered with the rinse liquid, a gas-liquid interface is not in contact with the upper surface of the substrate W. Therefore, it is possible to suppress or prevent foreign substances attracted to the gas-liquid interface from attaching to the upper surface of the substrate W.

After the rinse liquid is supplied over a time regulated by the recipe, the rinsing step is finished and the drying step is started.

In the low surface tension liquid replacing step, the low surface tension liquid is supplied at a relatively high initial-stage flow rate, and the rotational speed of the substrate is set to be rather high. Thereby, the liquid film of the low surface tension liquid covering the entire upper surface of the substrate can be promptly formed, and a major part of the rinse liquid can be replaced with the low surface tension liquid substantially at the same time over the entire upper surface of the substrate. In a state where the liquid film of the low surface tension liquid covers the entire upper surface of the substrate, the flow rate of the low surface tension liquid is reduced as shown by a reference symbol 115. Although the rotational speed of the substrate is not changed in the example of FIG. 5(b), the rotational speed of the substrate W may be reduced in addition to reduction in the flow rate of the low surface tension liquid. Thereby, the consumption amount of the low surface tension liquid is reduced, and the temperature of the liquid film on the substrate W is uniformized. Thus, replacement of the rinse liquid with the low surface tension liquid can uniformly progress over the entire surface of the substrate W with a low flow rate of the low surface tension liquid. At a time point when the supply of the low surface tension liquid is performed for a predetermined time, the supply of the low surface tension liquid is stopped.

In this example, the inert gas supplying step is performed over the entire period of the drying step. In the example of FIG. 5(a), after the low surface tension liquid replacing step, the flow rate of the inert gas is reduced (gradually reduced in the example of FIG. 5(a)) as shown by a reference symbol 116. Thereby, the substrate W is dried by necessary and sufficient supply of the inert gas.

Preferably, as shown in FIG. 5(a), the supply of the etching liquid and the supply of the rinse liquid are continuously performed, and the state where the upper surface of the substrate W is covered with the liquid film is maintained. Further, preferably, the supply of the rinse liquid and the supply of the low surface tension liquid are continuously performed, and the state where the upper surface of the substrate W is covered with the liquid film is maintained from start of the supply of the etching liquid to the replacement of the rinse liquid with the low surface tension liquid.

FIG. 6 shows an example of control of the supply flow rate of the processing liquid (the etching liquid and the rinse liquid) and the rotational speed of the substrate by the controller 30. The controller 30 may control the flow rate of the processing liquid and the rotational speed of the substrate while switching a control region between a first control region and a second control region. The first control region is a high-flow rate and high-rotation region, that is, the region where the flow rate of the processing liquid is high and the rotational speed of the substrate is high. More specifically, the first control region is defined by, for example, a flow rate range from 1.5 liters/min to 2.5 liters/min (high flow rate range) and, for example, a substrate rotational speed range from 800 rpm to 1,200 rpm (high rotation range). The second control region is defined by, for example, a flow rate range from 0.5 liters/min to 1.0 liter/min (low flow rate range) and, for example, a substrate rotational speed range from 100 rpm to 600 rpm (low rotation range).

The high flow rate range is a range of a relatively higher flow rate than the low flow rate range. In the example of FIG. 6, the entire portion of the high flow rate range has a larger flow rate value than the low flow rate range. However, the partial section of the lower limit side of the high flow rate range may overlap with the partial section of the upper limit side of the low flow rate range. The high rotation range is a range of relatively higher rotational speed than the low rotation range. In the example of FIG. 6, the entire portion of the high rotation range has a higher rotational speed value than the low rotation range. However, the partial section of the lower limit side of the high rotation range may overlap with the partial section of the upper limit side of the low rotation range. That is, in the example of FIG. 6, the first control region and the second control region do not have an overlapping range. However, the first and second control regions may have an overlapping region.

In the first control region, the controller 30 determines whether or not it is the entirely-covered state where the liquid film on the upper surface of the substrate covers the entire upper surface of the substrate. When it is determined that it is the entirely-covered state, the controller 30 switches the control region to the second control region. In the second control region, the controller 30 determines whether or not there is a sign indicating that the liquid film on the substrate W is going to break out from the entirely-covered state, that is, whether or not there is the liquid breakage sign. When it is determined that the liquid breakage sign appears, the controller 30 switches the control region to the first control region.

At an initial stage of processing liquid processing (the etching step and the rinsing step), the controller 30 selects the first control region. After that, the first control region and the second control region are switched in accordance with results of determination of the entirely-covered state and determination of liquid breakage.

In the first control region, the controller 30 may select one control point (one pair of the flow rate value and the rotational speed value) within the first control region, and control the flow rate of the processing liquid and the rotational speed of the substrate. In the first control region, by dynamically selecting any of plural control points (plural pairs of the flow rate value and the rotational speed value) within the first control region in accordance with the image taken by the camera 10, the controller 30 may control the liquid volume of the processing liquid and the rotational speed of the substrate.

Similarly, in the second control region, the controller 30 may select one control point (one pair of the flow rate value and the rotational speed value) within the second control region, and control the flow rate of the processing liquid and the rotational speed of the substrate. In the second control region, by dynamically selecting any of plural control points (plural pairs of the flow rate value and the rotational speed value) within the second control region in accordance with the image taken by the camera 10, the controller 30 may control liquid volume of the processing liquid and the rotational speed of the substrate.

Figure 7:
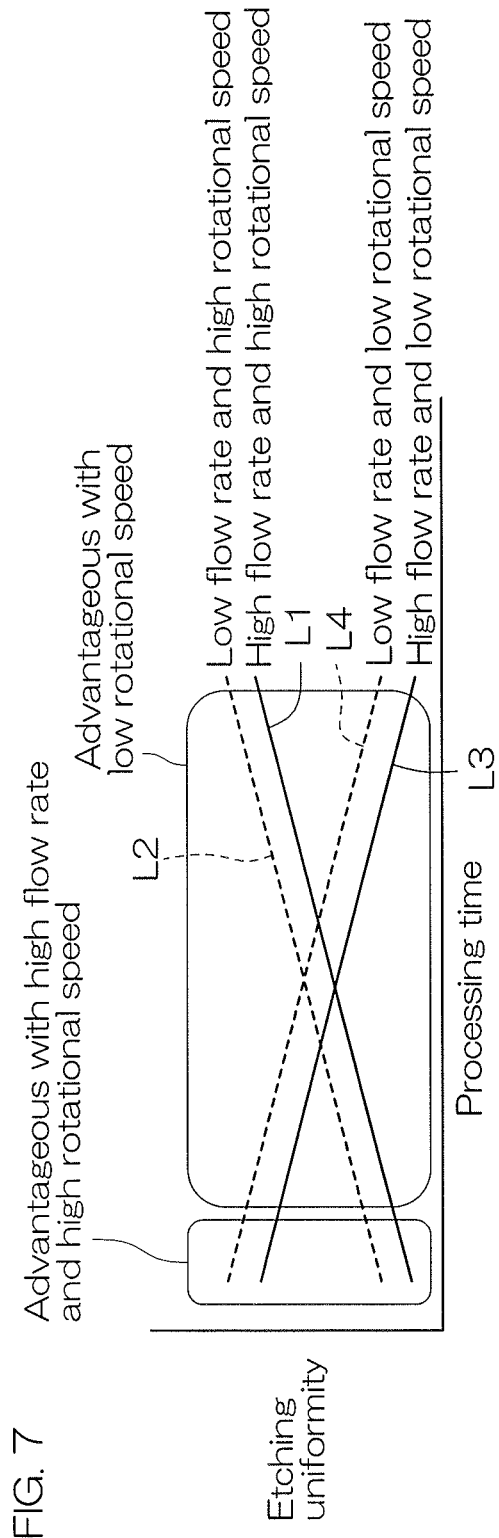
FIG. 7 is a concept view showing a relationship between the flow rate of the etching liquid and the rotational speed of the substrate, and etching uniformity.

FIG. 7 is a concept view showing a relationship between the flow rate of the etching liquid and the rotational speed of the substrate, and etching uniformity. The horizontal axis indicates a processing time, and the vertical axis indicates the etching uniformity. The etching uniformity indicates that the lower the value is, the less etching variation is and the more favorable the uniformity is.

When the substrate W is processed under high-flow rate and high-rotational speed conditions that the etching liquid is supplied at a high flow rate and the rotational speed of the substrate is set to be high rotation, there is a tendency that, as shown by a line L1, favorable etching uniformity is shown at the initial stage; however, the etching uniformity is deteriorated over time. The favorable etching uniformity at the initial stage is because the etching liquid instantaneously spreads on the substrate W due to the high-flow rate and high-rotational speed conditions, and etching is started substantially at the same time over the portions on the front surface of the substrate W. A major cause of deterioration of the etching uniformity over time is the high-rotational speed condition. That is, there is a large difference in the linear speed in the rotating direction between the rotation center and the peripheral edge portion of the substrate W. Thus, in the peripheral edge portion, the etching liquid is evaporated in the ambient atmosphere and evaporation heat is removed, so that a temperature of the etching liquid is lowered. Therefore, in the etching liquid, a large temperature difference is generated between the vicinity of the rotation center and the vicinity of a peripheral edge of the substrate W, and due to this, the etching uniformity is lost.

When the substrate W is processed under low-flow rate and high-rotational speed conditions that the etching liquid is supplied at a low flow rate and the rotational speed of the substrate is set to be high rotation, there is a similar tendency to the high-flow rate and high-rotational speed conditions (line L1) as shown by a line L2. Therefore, it is found that a progress of coverage of the etching liquid at the initial stage largely depends on the rotational speed of the substrate, and variation in the temperature of the etching liquid at middle and final stages also largely depends on the rotational speed of the substrate. However, under the condition that the flow rate of the etching liquid is low, in any period, the etching uniformity is slightly inferior to the high-flow rate and high-rotational speed conditions (line L1).

When the substrate W is processed under a high-flow rate and low-rotational speed conditions that the etching liquid is supplied at a high flow rate and the rotational speed of the substrate is set to be low rotation, there is a tendency that, as shown by a line L3, the etching uniformity is poor at the initial stage and the etching uniformity is improved over time. That is, due to the low rotational speed of the substrate, it takes time before the entire front surface of the substrate is covered with the etching liquid from start of the supply of the etching liquid. Thus, the etching uniformity is lost at the initial stage. Once the upper surface of the substrate W is covered with the liquid film, on the other hand, the temperature difference in the etching liquid between the rotation center and the peripheral edge portion of the substrate W is low due to the low rotational speed of the substrate W. Thus, favorable etching uniformity can be obtained.

When the substrate W is processed under low-flow rate and low-rotational speed conditions that the etching liquid is supplied at a low flow rate and the rotational speed of the substrate is set to be low rotation, there is a similar tendency to the high-flow rate and low-rotational speed conditions (line L3) as shown by a line L4. Therefore, it is found that the progress of the coverage of the etching liquid at the initial stage largely depends on the rotational speed of the substrate, and the variation in the temperature of the etching liquid at the middle and final stages also largely depends on the rotational speed of the substrate. However, under the condition that the flow rate of the etching liquid is low, in any period, the etching uniformity is slightly inferior to the high-flow rate and low-rotational speed conditions (line L3). However, since the etching uniformity is at the substantially equal level, the low-flow rate and low-rotational speed conditions (line L4) are more preferable from a viewpoint of reducing the consumption amount of the etching liquid.

From the above tendencies, the high-rotational speed conditions (lines L1, L2) are preferable at the initial stage of the etching processing, and the low-rotational speed conditions (lines L3, L4) are preferable after that. Furthermore preferably, while the high-rotational speed conditions (lines L1, L2) are selected at the initial stage of etching, the etching uniformity is enhanced by dynamically changing the rotational speed of the substrate in accordance with the state of the liquid film after that. Moreover, the high-flow rate and high-rotational speed conditions (line L1) are further preferable at the initial stage of etching, and the chemical liquid is preferably saved under the low-flow rate and low-rotational speed conditions (L3) after that. Furthermore preferably, while the high-flow rate and high-rotational speed conditions (line L1) are selected at the initial stage of etching, the etching uniformity is enhanced by dynamically changing the rotational speed of the substrate and the flow rate of the etching liquid in accordance with the state of the liquid film after that.

Figure 8:
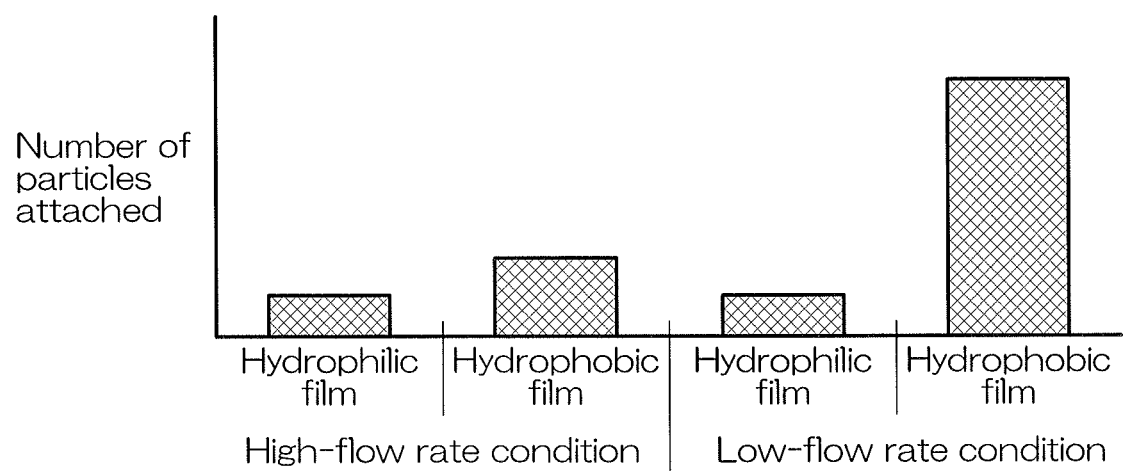
FIG. 8 shows an example of a test result showing a relationship among the flow rate of the processing liquid (the etching liquid or the rinse liquid), a state of a front surface of the substrate (hydrophilic surface/hydrophobic surface), and the number of particles attached to the front surface of the substrate.

FIG. 8 shows an example of a test result showing a relationship among the flow rate of the processing liquid (the etching liquid or the rinse liquid), a state of the front surface of the substrate (hydrophilic surface/hydrophobic surface), and the number of particles attached to the front surface of the substrate. Under the high-flow rate condition, irrespective of the front surface of the substrate being a hydrophilic surface or a hydrophobic surface, there is no large difference in the number of particles attached. This is because when the processing liquid is supplied at a high flow rate, and even when the front surface of the substrate is a hydrophobic surface, the entire front surface is covered with the processing liquid. Under the low-flow rate condition, on the other hand, the number of particles attached is low when the front surface of the substrate is a hydrophilic surface, whereas the number of particles attached is remarkably high when the front surface of the substrate is a hydrophobic surface. This is because when the front surface of the substrate is a hydrophobic surface, the liquid film is broken with supply of the processing liquid at a low flow rate, so that the front surface of the substrate is partially exposed. That is, it is considered that foreign substances (particles) are attracted to the gas-liquid interface in contact with the front surface of the substrate, and therefore, the particles are generated.

When the front surface of the substrate is a hydrophilic surface, the coverage to cover the entire front surface of the substrate can be secured with supply of the processing liquid at a small flow rate. When the front surface of the substrate is a hydrophobic surface, on the other hand, the coverage for the entire front surface of the substrate is preferably secured with supply of the processing liquid at a large flow rate.

Thus, in the present preferred embodiment, a situation of the coverage for the front surface of the substrate is determined based on the image taken by the camera 10, and based on the determination, the flow rate of the processing liquid and the rotational speed of the substrate are changed. Thereby, the flow rate of the processing liquid and the rotational speed of the substrate are dynamically changed in accordance with a change in the state of the front surface of the substrate, so that the processing liquid can be supplied at a necessary and sufficient flow rate. Therefore, it is possible to secure the coverage during a processing period with the processing liquid without supplying the processing liquid at an excessive flow rate, and it is possible to suppress a consumption amount of the processing liquid without losing particle performance.

FIG. 9A to FIG. 9D show examples of the image taken by the camera 10. An image taking region of the camera 10 includes, for example, the entire upper surface of the substrate W. Images shown in FIG. 9A to FIG. 9D are part of the images taken by the camera 10, more specifically, partial images extracting images of the peripheral edge portion of the substrate. The entirely-covered state and the liquid breakage sign can be determined by using the partial image of the peripheral edge portion of the substrate.

Figure 9B:
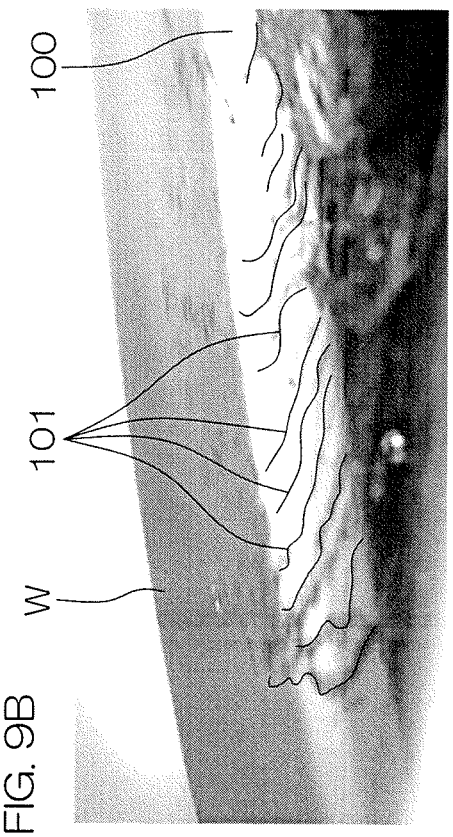
FIG. 9A to FIG. 9D show examples of an image of a peripheral edge portion of the substrate taken by a camera.
Figure 9D:
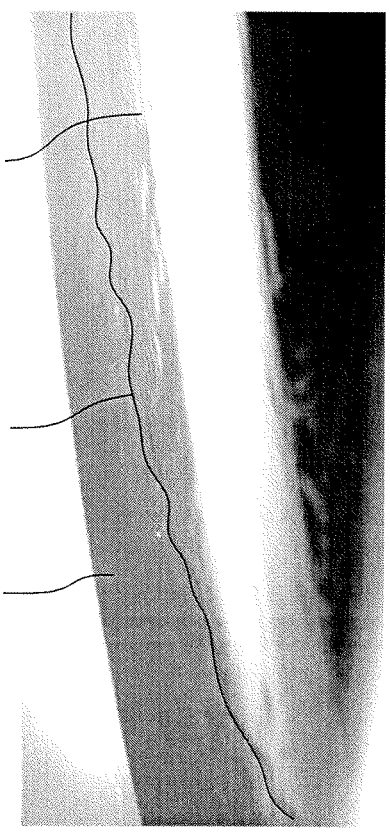
Figure 9A:
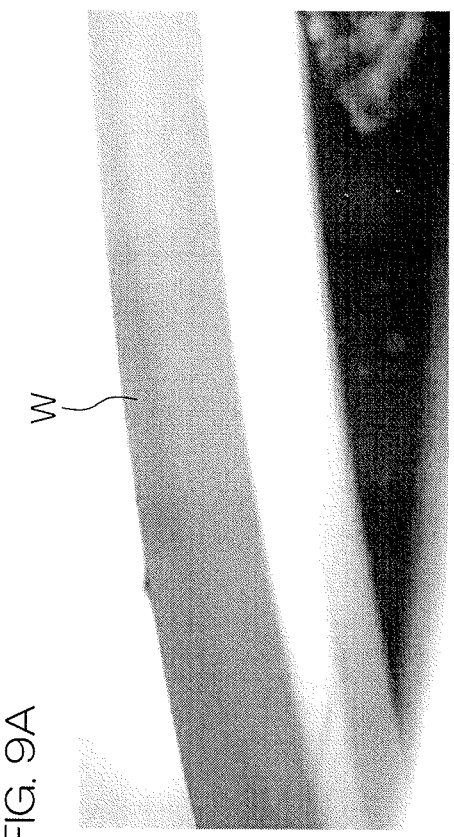
Figure 9C:
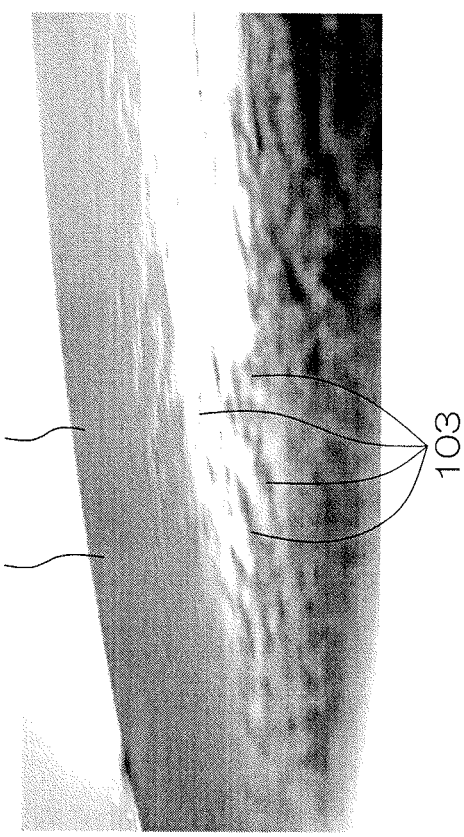

FIG. 9A is an image example taken at the time when there is no liquid on the front surface of the substrate W (silicon wafer in this example). The front surface of the substrate is a mirror surface. FIG. 9B is an image example of a state where a liquid is supplied to the front surface of the substrate W and the liquid does not yet cover the entire front surface of the substrate, that is, an image example of the state in the middle of covering. A liquid film 100 is in the process of spreading toward an outer peripheral surface of the substrate W. Thus, plural waves 101 appear in a layered form at narrow intervals. FIG. 9C is an image example of a state where a liquid film 102 covering the entire front surface of the substrate W is formed, that is, an image example of the entirely-covered state. In the entirely-covered state, tiny recesses 103 are uniformly distributed on a front surface of the liquid film 102, and thickness of the liquid film 102 is uniform. Thus, there are no waves taking on linear patterns. FIG. 9D is an image example in which the sign breaking out from the entirely-covered state, that is, the liquid breakage sign appears. Before the liquid breakage is generated, thickness of a liquid film 104 becomes non-uniform. Typically, the liquid film 104 becomes relatively thin in the peripheral edge portion of the substrate. Thus, a large wave 105 taking on an independent linear pattern along a shape of the peripheral end surface of the substrate W appears.

By determining transition from the state where a mirror surface image (FIG. 9A) appears in the peripheral edge portion of the substrate W to the state where tiny recesses uniformly appear in the peripheral edge portion of the substrate W (FIG. 9C) based on the image taken by the camera 10, reaching the entirely-covered state can be determined. By recognizing the state where tiny recesses uniformly appear in the peripheral edge portion of the substrate W (FIG. 9C), the entirely-covered state can be determined. By recognizing the state where a large wave taking on an independent linear pattern appears (FIG. 9D), the liquid breakage sign can be determined.

More specifically, for example, by performing filter processing of extracting characteristics of the image of FIG. 9C (such as edge enhancement processing) on the image data output by the camera 10 and obtaining a filter value (characteristic amount) of the entire image, the entirely-covered state can be determined by using the filter value. For example, the liquid breakage sign may be determined by image recognition processing of performing the filter processing such as edge enhancement on the image data and recognizing whether or not there is an independent linear pattern in the image after the filter processing.

Figure 10:
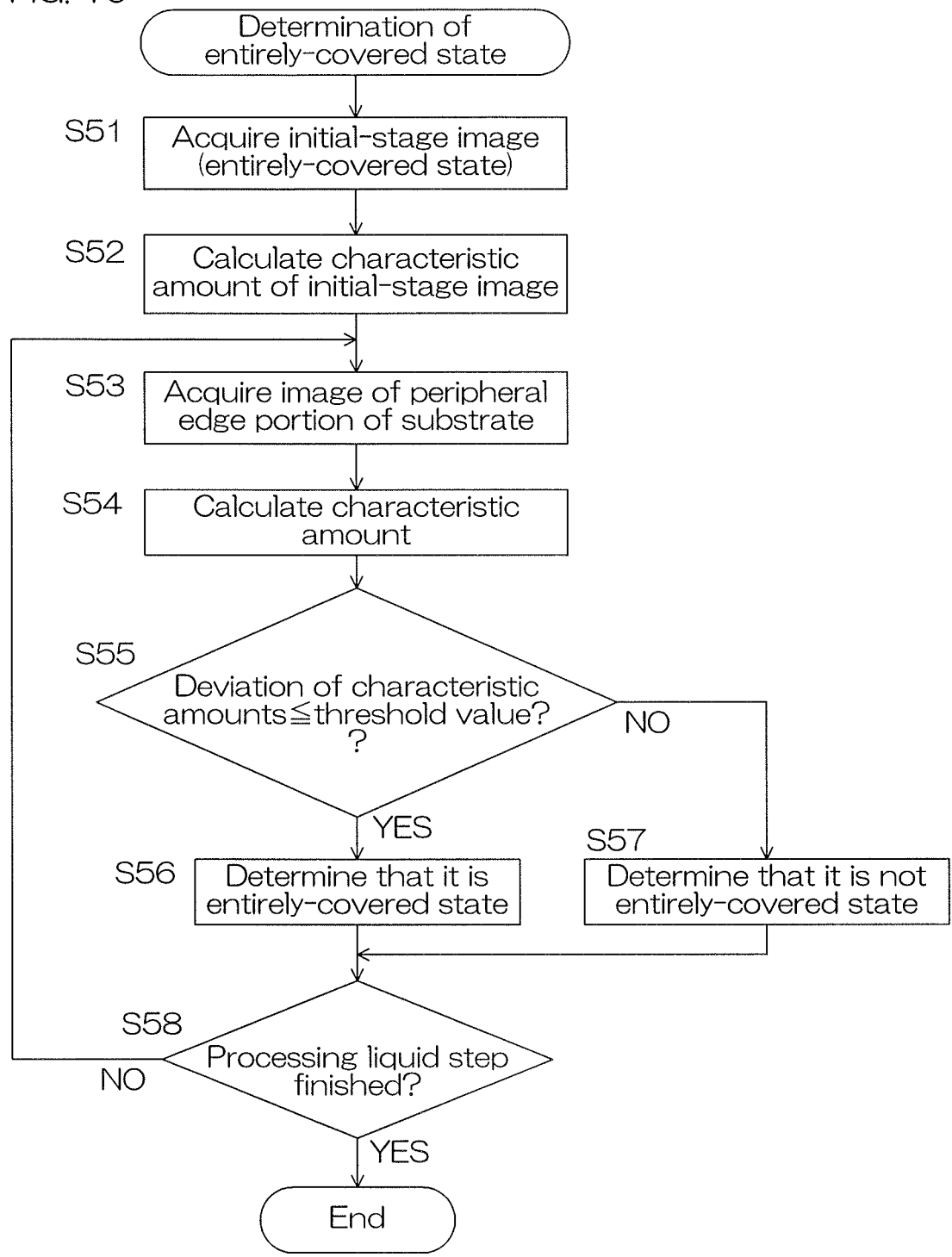
FIG. 10 is a flowchart for describing a specific example of determination processing of an entirely-covered state (Steps S5 and S16 of FIG. 3A).

FIG. 10 is a flowchart for describing a specific example of the determination processing of the entirely-covered state (Steps S5 and S16 of FIG. 3A). At an initial stage where the supply of the processing liquid (the etching liquid or the rinse liquid) is started, as described above, the conditions become the high-flow rate and high-rotational speed conditions, and the entire front surface of the substrate W is instantaneously covered with the liquid film. Thus, it stands by for a fixed time after the supply of the processing liquid is started, and then the image of the peripheral edge portion of the substrate is extracted from the image taken by the camera 10 (Step S51). This image is an initial-stage image of the entirely-covered state. A characteristic amount (such as the filter value described above) of this initial-stage image is calculated and stored in the storage device 32 (Step S52). After that, the controller 30 extracts the image of the peripheral edge portion of the substrate from the image taken by the camera 10 at predetermined time intervals (Step S53: a liquid film image taking step), and calculates the characteristic amount (such as the filter value described above) (Step S54: an image analyzing step). The characteristic amount is compared with the characteristic amount of the initial-stage image (Step S55: an entirely-covered state determining step). When a deviation of the characteristic amounts is not more than a predetermined threshold value (YES in Step S55), the controller 30 determines that it is the entirely-covered state (Step S56). When the deviation of the characteristic amounts exceeds the threshold value (NO in Step S55), the controller 30 determines that it is not the entirely-covered state (Step S57). After that, until the processing liquid step in execution (the etching step or the rinsing step) is finished, the processing from Step S53 is repeated (Step S58).

Determination of the entirely-covered state in the low surface tension liquid replacing step performed at the initial stage of the drying step (Step S28 of FIG. 3B) is substantially similar.

FIG. 11 is a flowchart for describing a specific example of the determination processing of the liquid breakage sign (Steps S8 and S19 of FIG. 3A). The controller 30 executes determination of the liquid breakage sign after the entirely-covered state is detected. The controller 30 acquires the image data output by the camera 10 at the predetermined time intervals, and cuts out the image of the peripheral edge of the substrate from the image data (Step S61: a liquid film image taking step). The controller 30 performs filter processing such as edge enhancement on the cut image (Step S62: an image analyzing step). The controller 30 performs image recognition processing to recognize an independent linear pattern on the image after the filter processing (Step S63: an image analyzing step). When an independent linear pattern is confirmed as a result of the image recognition processing (YES in Step S64: a liquid breakage sign determining step), the controller 30 determines that the liquid breakage sign appears (Step S65). When there is no such linear pattern (NO in Step S64), the controller 30 determines that no liquid breakage sign appears (Step S66). After that, until the processing liquid step in execution (the etching step or the rinsing step) is finished, the processing from Step S61 is repeated (Step S67).

Determination of the liquid breakage sign in the low surface tension liquid replacing step performed at the initial stage of the drying step (Step S31 of FIG. 3B) is substantially similar.

A preferred embodiment of the present invention is described above. However, the present invention can be implemented in other modes. For example, in the above preferred embodiment, the etching processing of removing the film (such as the silicon oxide film) formed on the front surface of the substrate W is mainly described. However, substrate cleaning processing of utilizing an etching action of a chemical liquid is also included in the "etching processing." In addition, the present invention is not limited to the etching processing but can also be applied to other types of substrate processing performed by using a processing liquid.

In the above preferred embodiment, based on the image of the liquid film on the upper surface of the substrate taken by the camera 10, the entirely-covered state and the liquid breakage sign are determined and the rotational speed of the substrate and the flow rate of the processing liquid are increased/reduced. However, control of narrowing down to an optimal substrate rotational speed condition and an optimal processing liquid flow rate condition by recognizing the state of the liquid film in more detail and variably setting the rotational speed of the substrate and the flow rate of the processing liquid based on the recognition may be executed.

In the above preferred embodiment, the state of the liquid film is recognized and determined by the image of the liquid film taken by the camera 10. However, the present invention is not limited to such determination of using the image but, for example, an arrangement in which the state of the liquid film is detected by using a film thickness sensor that detects thickness of the liquid film may be adopted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
    a substrate rotating step of rotating a substrate in a horizontal posture;
    a processing liquid supplying step of supplying a processing liquid to an upper surface of the substrate which is being rotated in the substrate rotating step;
    a liquid film state monitoring step of monitoring a state of a liquid film formed on the upper surface of the substrate by the processing liquid supplied to the upper surface of the substrate;
    an entirely-covered state determining step of determining whether the liquid film monitored in the liquid film state monitoring step entirely covers the upper surface of the substrate after the processing liquid supplying step is started; and
    a substrate rotational speed changing step of changing rotational speed of the substrate in accordance with the state of the liquid film monitored in the liquid film state monitoring step during execution of the processing liquid supplying step, the substrate rotational speed changing step including a rotation decelerating step of reducing the rotational speed of the substrate when the entirely-covered state determining step has determined that the liquid film entirely covers the upper surface of the substrate.

2. The substrate processing method according to claim 1, further comprising:
    a liquid breakage sign determining step of determining whether or not there is a liquid breakage sign indicating that the liquid film monitored in the liquid film state monitoring step is going to break out from an entirely-covered state where the liquid film entirely covers the upper surface of the substrate after the processing liquid supplying step is started, wherein
    the substrate rotational speed changing step includes a rotation accelerating step of increasing the rotational speed of the substrate when the liquid breakage sign determining step has determined that the liquid film has the liquid breakage sign.

3. The substrate processing method according to claim 1, further comprising:
    a processing liquid flow rate changing step of changing a flow rate of the processing liquid supplied to the substrate in accordance with the state of the liquid film monitored in the liquid film state monitoring step during execution of the processing liquid supplying step.

4. The substrate processing method according to claim 3, wherein
the processing liquid flow rate changing step includes a processing liquid reducing step of reducing the flow rate of the processing liquid when the entirely-covered state determining step has determined that the liquid film entirely covers the upper surface of the substrate.

5. The substrate processing method according to claim 3, further comprising:
a liquid breakage sign determining step of determining whether or not there is a liquid breakage sign indicating that the liquid film monitored in the liquid film state monitoring step is going to break out from an entirely-covered state where the liquid film entirely covers the upper surface of the substrate after the processing liquid supplying step is started, wherein
the processing liquid flow rate changing step includes a processing liquid increasing step of increasing the flow rate of the processing liquid when the liquid breakage sign determining step has determined that the liquid film has the liquid breakage sign.

6. The substrate processing method according to claim 1, wherein
the processing liquid is an etching liquid.

7. The substrate processing method according to claim 1, wherein
the processing liquid is a rinse liquid.

8. The substrate processing method according to claim 1, wherein
the liquid film state monitoring step includes a liquid film image taking step of taking an image of the liquid film formed on the upper surface of the substrate, and an image analyzing step of analyzing the image of the liquid film taken in the liquid film image taking step.

9. The substrate processing method according to claim 1, wherein the substrate has a front surface whose lyophilic level with respect to the processing liquid is changed by processing with the processing liquid.

10. The substrate processing method according to claim 1, further comprising:
a drying step of drying a liquid component on the upper surface of the substrate after the processing liquid supplying step; and
a dry state determining step of determining a dry state of the substrate based on the state of the liquid film monitored in the liquid film state monitoring step.

11. The substrate processing method according to claim 10, wherein
the drying step includes an inert gas supplying step of supplying an inert gas to the upper surface of the substrate, and an inert gas flow rate changing step of changing a flow rate of the inert gas based on determination of the dry state of the substrate in the dry state determining step.

12. A substrate processing apparatus comprising:
a substrate rotating unit that rotates a substrate in a horizontal posture;
a processing liquid supplying unit that supplies a processing liquid to an upper surface of the substrate which is being rotated by the substrate rotating unit;
a camera that takes an image of the processing liquid supplied to the upper surface of the substrate; and
a controller that controls the substrate rotating unit and the processing liquid supplying unit based on the image taken by the camera, wherein
the controller is programmed to execute the steps of the substrate processing method according to claim 1.

13. A recording medium on which a program to be executed by a computer provided in a substrate processing apparatus is recorded, the computer program incorporating execution steps to execute the substrate processing method according to claim 1 in the substrate processing apparatus.

14. A substrate processing method comprising:
a substrate rotating step of rotating a substrate in a horizontal posture;
a processing liquid supplying step of supplying a processing liquid to an upper surface of the substrate which is being rotated in the substrate rotating step;
a liquid film state monitoring step of monitoring a state of a liquid film formed on the upper surface of the substrate by the processing liquid supplied to the upper surface of the substrate;
an entirely-covered state determining step of determining whether the liquid film monitored in the liquid film state monitoring step entirely covers the upper surface of the substrate after the processing liquid supplying step is started; and
a processing liquid flow rate changing step of changing a flow rate of the processing liquid supplied to the substrate in accordance with the state of the liquid film monitored in the liquid film state monitoring step during execution of the processing liquid supplying step, the processing liquid flow rate changing step including a processing liquid reducing step of reducing the flow rate of the processing liquid when the entirely-covered state determining step has determined that the liquid film entirely covers the upper surface of the substrate.

15. The substrate processing method according to claim 14, further comprising
a substrate rotational speed changing step of changing rotational speed of the substrate in accordance with the state of the liquid film monitored in the liquid film state monitoring step during execution of the processing liquid supplying step.

16. The substrate processing method according to claim 14, further comprising:
a liquid breakage sign determining step of determining whether or not there is a liquid breakage sign indicating that the liquid film monitored in the liquid film state monitoring step is going to break out from an entirely-covered state where the liquid film entirely covers the upper surface of the substrate after the processing liquid supplying step is started, wherein
the processing liquid flow rate changing step includes a processing liquid increasing step of increasing the flow rate of the processing liquid when the liquid breakage sign determining step has determined that the liquid film has the liquid breakage sign.

17. A substrate processing apparatus comprising:
a substrate rotating unit that rotates a substrate in a horizontal posture;
a processing liquid supplying unit that supplies a processing liquid to an upper surface of the substrate which is being rotated by the substrate rotating unit;
a camera that takes an image of the processing liquid supplied to the upper surface of the substrate; and a controller that controls the substrate rotating unit and the processing liquid supplying unit based on the image taken by the camera, wherein the controller is programmed to execute the steps of the substrate processing method according to claim 14.

18. A substrate processing method comprising:

a substrate rotating step of rotating a substrate in a horizontal posture;

a processing liquid supplying step of supplying a processing liquid to an upper surface of the substrate which is being rotated in the substrate rotating step;

a liquid film state monitoring step of monitoring a state of a liquid film formed on the upper surface of the substrate by the processing liquid supplied to the upper surface of the substrate;

a liquid breakage sign determining step of determining whether or not there is a liquid breakage sign indicating that the liquid film monitored in the liquid film state monitoring step is going to break out from an entirely-covered state where the liquid film entirely covers the upper surface of the substrate after the processing liquid supplying step is started; and a processing liquid flow rate changing step of changing a flow rate of the processing liquid supplied to the substrate in accordance with the state of the liquid film monitored in the liquid film state monitoring step during execution of the processing liquid supplying step, the processing liquid flow rate changing step including a processing liquid increasing step of increasing the flow rate of the processing liquid when the liquid breakage sign determining step has determined that the liquid film has the liquid breakage sign.

19. The substrate processing method according to claim 18, further comprising a substrate rotational speed changing step of changing rotational speed of the substrate in accordance with the state of the liquid film monitored in the liquid film state monitoring step during execution of the processing liquid supplying step.

20. A substrate processing apparatus comprising:

a substrate rotating unit that rotates a substrate in a horizontal posture;

a processing liquid supplying unit that supplies a processing liquid to an upper surface of the substrate which is being rotated by the substrate rotating unit;

a camera that takes an image of the processing liquid supplied to the upper surface of the substrate; and a controller that controls the substrate rotating unit and the processing liquid supplying unit based on the image taken by the camera, wherein the controller is programmed to execute the steps of the substrate processing method according to claim 18.

* * * * *